United States Patent
Nosaka et al.

(10) Patent No.: US 7,054,403 B2
(45) Date of Patent: May 30, 2006

(54) PHASE-LOCKED LOOP

(75) Inventors: Hideyuki Nosaka, Musashino (JP);
Hiroyuki Fukuyama, Musashino (JP);
Hideki Kamitsuna, Musashino (JP)

(73) Assignees: Nippon Telegraph and Telephone Corporation, Tokyo (JP); NTT Electronics Corporation, Tokyo (JP)

( * ) Notice: Subject to any disclaimer, the term of this patent is extended or adjusted under 35 U.S.C. 154(b) by 786 days.

(21) Appl. No.: 09/979,254

(22) PCT Filed: Mar. 21, 2001

(86) PCT No.: PCT/JP01/02215

§ 371 (c)(1),
(2), (4) Date: Nov. 20, 2001

(87) PCT Pub. No.: WO01/71921

PCT Pub. Date: Sep. 27, 2001

(65) Prior Publication Data
US 2002/0159554 A1    Oct. 31, 2002

(30) Foreign Application Priority Data

Mar. 21, 2000 (JP) ............................. 2000-077934
Jul. 4, 2000 (JP) ............................. 2000-201851

(51) Int. Cl.
*H03D 3/24* (2006.01)
(52) U.S. Cl. ...................... 375/376; 375/373
(58) Field of Classification Search ............... 375/376, 375/317; 331/17, 8, 2; 455/260
See application file for complete search history.

(56) References Cited

U.S. PATENT DOCUMENTS

| | | | |
|---|---|---|---|
| 4,027,274 A * | 5/1977 | Fukui et al. | 332/127 |
| 4,186,281 A * | 1/1980 | Kasuga et al. | 369/88 |
| 4,335,383 A * | 6/1982 | Berry | 342/115 |
| 5,006,819 A * | 4/1991 | Buchan et al. | 331/1 A |
| 5,382,922 A | 1/1995 | Gersbach et al. | |
| 5,719,908 A | 2/1998 | Greeff et al. | |

FOREIGN PATENT DOCUMENTS

| | | |
|---|---|---|
| EP | 0 308 285 | 3/1989 |
| EP | 0 412 491 | 2/1991 |
| EP | 918396 A1 * | 5/1999 |
| JP | 58-144928 | 9/1983 |
| JP | 2-100348 | 8/1990 |
| JP | H2-311021 | 12/1990 |
| JP | 08-130468 * | 5/1996 |
| JP | 09135167 A * | 5/1997 |
| JP | 10261956 A * | 9/1998 |

* cited by examiner

*Primary Examiner*—Stephen Chin
*Assistant Examiner*—Jia Lu
(74) *Attorney, Agent, or Firm*—Koda & Androlia

(57) ABSTRACT

A phase lock circuit has a signal path to which a phase comparator, a loop filter and a voltage control oscillator are connected in series, the phase comparator being adapted to compare the phase of an input signal $V_{IN}$ with the phase in the output signal of the voltage control oscillator and to output its result of comparison, the loop filter being adapted to receive the output signal of the phase comparator and to output a DC voltage; the voltage control oscillator being adapted to control the output oscillation frequency depending on the DC output voltage of the loop filter, the phase lock circuit further comprising voltage tracking means for adding, to the voltage of the signal path, a signal causing the average voltage in the output voltage of the phase comparator to coincide with a predetermined reference voltage, whereby the voltage tracking means can enlarge the lock range in the phase lock circuit.

22 Claims, 27 Drawing Sheets

PS 7

PS8

PS111

PRIOR ART

PRIOR ART

PRIOR ART

PS112

PRIOR ART

PRIOR ART

Fig. 24
(1) 26k (26m)
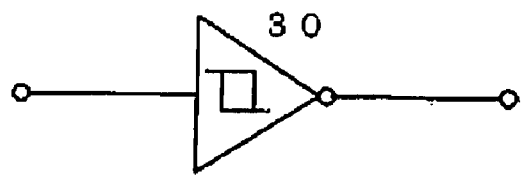
(2)
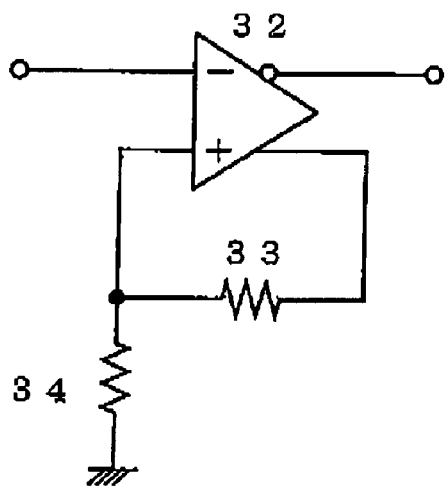
(3)
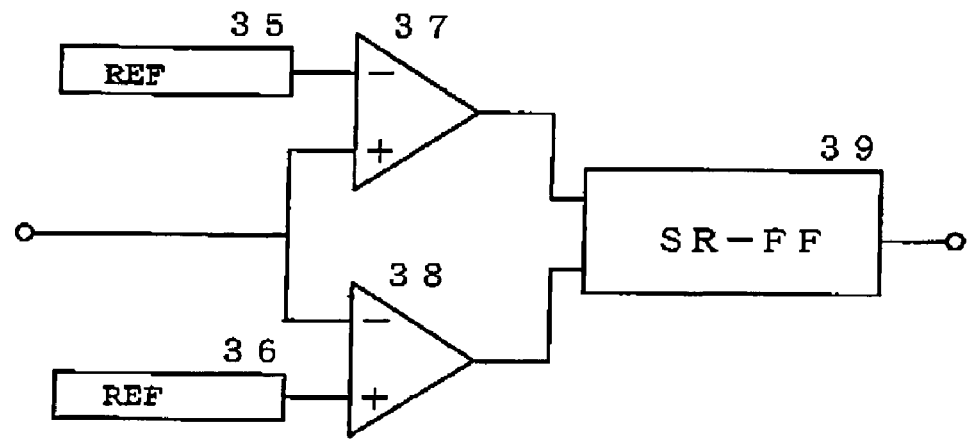

Fig. 29
(1) OUTPUT EN AT VOLTAGE DIFFERENCE DETECTOR 40p
(2) OUTPUT AT PULSE GENERATOR 23p
(3) OUTPUT $V_{FB}$ AT D/A CONVERTER 25p
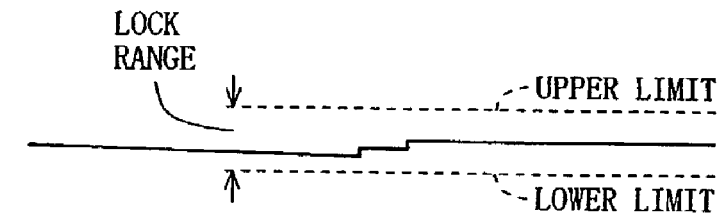
(4) AVERAGE VOLTAGE IN OUTPUT AT PHASE COMPARATOR 1p
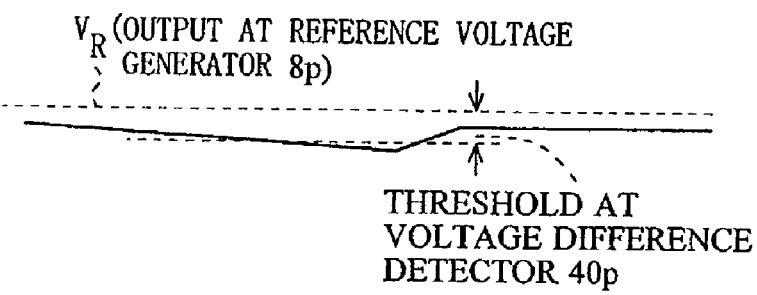

PHASE-LOCKED LOOP

FIELD OF THE INVENTION

The present invention relates to a phase lock circuit (phase-locked loop circuit) usable in optical communication and radio communication devices and particularly to a phase lock circuit which can surely continue the lock at an ultra-high frequency band (which is substantially equal to or higher than 5 GHz) whereat clock and data recovery(CDR) and phase-frequency comparison circuits cannot be used since they have narrower lock ranges and tend to create unlocking, even if the aged deterioration of parts, temperature change, variation of supply voltage and other undesirable events occur.

BACKGROUND OF THE ART

FIG. 14 is a block diagram of a phase lock circuit(phase-locked loop circuit) PS111 according to the prior art.

The phase lock circuit PS111 comprises a phase comparator 1$i$, a loop filter 2$i$, a voltage control oscillator(voltage-controlled oscillator) 3$i$, a signal input terminal 7$i$ and a signal output terminal 9$i$. The phase comparator 1$i$ is formed by an EXOR circuit.

FIG. 15 (1) shows the waveform of an input signal 7$i$ ($V_{IN}$); FIG. 15 (2) shows the waveform of the output from the voltage control oscillator 3$i$; FIG. 15 (3) shows the waveform of the output from the phase comparator 1$i$; and FIG. 15 (4) shows the waveform of the output from the loop filter 2$i$.

It is assumed therein that the duty ratio of the pulse of the input signal 7$i$ ($V_{IN}$) shown in FIG. 15 (1) and the pulse of the voltage control oscillator 3$i$ shown in FIG. 15 (2) is equal to 50%.

As shown in FIG. 15 (3), the duty ratio in the phase comparator 1$i$ is determined by the leading edge timing in the pulse of the input signal 7$i$ ($V_{IN}$) shown in FIG. 15 (1) and the leading edge timing in the output pulse of the voltage control oscillator 3$i$ shown in FIG. 15 (2).

The output level of the loop filter 2$i$ shown in FIG. 15 (4) is determined by the duty ratio of the phase comparator 1$i$ shown in FIG. 15 (3) while the oscillation frequency of the voltage control oscillator 3$i$ is determined by the output level of the loop filter 2$i$.

Namely, in the phase lock circuit PS111 of the prior art shown in FIG. 14, the phase difference between the pulse of the input signal 7$i$ ($V_{IN}$) shown in FIG. 15 (1) and the output pulse of the voltage control oscillator 3$i$ shown in FIG. 15 (2) determine the oscillation frequency of the voltage control oscillator 3$i$.

When the phase lock circuit PS111 is in its locked state, the above-mentioned phase difference is determined such that the frequency (or bit rate) of the input signal 7$i$ ($V_{IN}$) shown in FIG. 15 (1) coincides with the output frequency of the voltage control oscillator 3$i$.

FIG. 15 (1) shows a case where the phase difference is equal to 125 while FIG. 15 (2) shows another case where the phase difference is equal to 90.

If the control coefficient of the voltage control oscillator 3$i$ (or ratio between the control voltage and the output frequency) is positive and when the right-side graphs (II) of FIG. 15 are reference, the left-side graphs (I) of FIG. 15 illustrate that the frequency (or bit rate) of the input signal 7$i$ ($V_{IN}$) is higher.

FIG. 16 shows changes in the output voltage of the loop filter 2$i$ when the frequency (or bit rate) of the input signal 7$i$ ($V_{IN}$) is changed.

The phase lock circuit PS111 is in its locked state in the middle area of the lock range (or area between the lower and upper ends of the lock range).

As the frequency (or bit rate) of the input signal 7$i$ ($V_{IN}$) varies, the aforementioned phase difference also varies to change the duty ratio in the output signal of the phase comparator 1$i$ and the output voltage of the loop filter 2$i$.

However, the duty ratio has the lower limit (0%) and the upper limit (100%). In other words, the limits of the duty ratio in the output of the phase comparator 1$i$ exist in the upper and lower ends of the lock range.

If the phase lock circuit is to be applied to the communication system, the parameters of the phase lock circuit (e.g., loop filter bandwidth and gain) must be determined such that the specification of a frequency synthesizer such as phase noise characteristic or the specification of CDR such as jitter tolerance will be satisfied. This raises a problem in that a sufficiently broad lock range cannot be provided.

If the lock range is not sufficiently broad and when a drift occurs in the oscillation frequency due to various environmental variations such as the aged deterioration of the voltage control oscillator (VCO), temperature change and supply voltage variation, there is raised a problem in that the lock cannot be held. In addition, the oscillation frequency of the voltage control oscillator must accurately be pre-regulated on shipment.

If the phase lock circuit additionally includes a retraction circuit (see Japanese Patent Application No. Hei 8-130468), it raises still another problem in that the lock range would extremely be reduced.

The retraction circuit is added to the phase lock circuit for enlarging the pull-in range therein. When the phase lock circuit is in its unlock state, the retraction circuit inputs a scanning signal into the voltage control oscillator to change the oscillation frequency greatly. As the oscillation frequency approaches to the frequency of the input signal, the retraction circuit retracts the phase lock circuit. Thereafter, the locked state of the phase lock circuit is detected and the phase lock circuit is controlled to hold the voltage in the scanning signal, thereby maintaining the locked state thereof.

However, the retraction circuit does not have a function of lock-range enlargement. If the retraction circuit retracts the oscillation frequency at the end of the lock range, the substantial lock range (or minimum distance between the retracting frequency and the lock range end) will extremely be reduced. This raises a further problem in that the locked state will not be maintained stable.

An object of the present invention is provide a phase lock circuit which can provide a very broad lock range even if the lock range is reduced by regulating the parameters of the phase lock circuit to satisfy the jitter tolerance and so on or even if the lock range is substantially reduced by adding the retraction circuit into the phase lock circuit.

FIG. 17 is a block diagram of another phase lock circuit PS112 according to the prior art, into which a retraction circuit according to the prior art is added.

The phase lock circuit PS112 comprises a phase comparator 1$n$, a loop filter 2$n$, a voltage control oscillator 3$n$, a signal input terminal 7$n$, a signal output terminal 9$n$, a lock detector 21$n$, an additional loop or retraction circuit FS1 and an adder 6. The phase comparator 1$n$, loop filter 2$n$ and voltage control oscillator 3$n$ together define the main body of the phase lock circuit. The retraction circuit FS1 comprises a pulse generator 23n, a counting circuit 24n and a D/A converter 25n, as shown in Japanese Patent Application No. Hei 8-130468.

The retraction circuit FS1 is added to the phase lock circuit for enlarging the pull-in range therein. When the phase lock circuit is its unlocked state, the retraction circuit FS1 inputs a scanning signal to the voltage control oscillator 3n to change the oscillation frequency thereof greatly. As the oscillation frequency approaches to the frequency of the input signal, the retraction circuit FS1 retracts the phase lock circuit. Thereafter, the locked state of the phase lock circuit is detected. At this time, the retraction circuit controls the phase lock circuit to hold the voltage of the scanning signal and to maintain the locked state of the phase lock circuit.

FIG. 18 shows waveforms in the primary parts of the phase lock circuit PS112 into which the retraction circuit is added.

FIG. 18 (1) shows the waveform in the output signal of the loop filter 2n; FIG. 18 (2) shows the waveform in the output signal of the lock detector 21n; FIG. 18 (3) shows the waveform in the output signal of the pulse generator 23n; and FIG. 18 (4) shows the waveform in the output signal of the D/A converter 25n.

In the initial stage of the time chart (left side about a dotted line), the phase lock circuit PS211 is in its unlocked state which is discriminated by the lock detector 21n. The pulse generator 23n produces a pulse. In association with this, the counting circuit 24n varies its count while the D/A converter 3n changes its output voltage in a stepwise manner. The output, voltage of the D/A converter 25n varies the oscillation frequency of the voltage control oscillator 3n. As the oscillation frequency approaches to the frequency of the input signal, the phase lock circuit is retracted. Thereafter, the lock detector 21n discriminates the locked state of the phase lock circuit and the pulse generator 23n is stopped. The counting circuit 24n maintains its count constant while the D/A converter 25n maintains its output voltage constant to hold the locked state of the phase lock circuit. As a result, the pull-in range can be enlarged within a range in which the oscillation frequency of the voltage control oscillator 3n is variable.

On the other hand, there exists the output voltage range of the D/A converter 25n in which the locked state of the phase lock circuit can be maintained (see FIG. 18 (4)). However, the actuation of the lead-in(retraction) circuit not necessarily causes the output signal of the D/A converter 25n to occur at a position near the center of this voltage range. If the locked state is maintained at a position near the lower (or upper) limit of the lock range as shown in FIG. 18 (4), the substantial lock range (or minimum distance between the retracting frequency and the lock range end) will extremely be reduced. In such a case, the locked state cannot be maintained stable due to the subsequent environmental variation such as supply voltage variation, temperature change, jitter input).

Even if the phase lock circuit is unlocked, it will again be retracted by the lead-in(retraction) circuit. However, this raises further problems in that a spurious radiation occurs during a period between the unlocking and the completion of re-retraction (if the phase lock circuit is applied to a frequency synthesizer) and in that the data is lost (if the phase lock circuit is applied to CDR).

The present invention is to provide a phase lock circuit which can enlarge the lock range thereof and maintain the locked state stable, even though the above-mentioned lead-in(retraction) circuit is added to the phase lock circuit.

DISCLOSURE OF THE INVENTION

The present invention provides a phase lock circuit(phase-locked loop circuit) comprising a signal path connected in series with a phase comparator, a loop filter and a voltage control oscillator(voltage-controlled oscillator), said phase comparator being adapted to compare the phase of an input signal with the phase in the output signal of said voltage control oscillator and to output its result of comparison, said loop filter being adapted to receive the output signal of said phase comparator and to output a DC voltage; said voltage control oscillator being adapted to control the output oscillation frequency depending on the DC output voltage of said loop filter, said phase lock circuit further comprising voltage tracking circuit for adding, to the voltage of said signal path, a signal causing the average voltage in the output voltage of said phase comparator to coincide with a predetermined reference voltage, whereby said voltage tracking circuit can enlarge the lock range in said phase lock circuit.

BRIEF DESCRIPTION OF THE DRAWINGS

FIG. 12 shows waveforms in the primary parts of the phase lock circuit PS7.

FIG. 13 is a block diagram of still another phase lock circuit PS8 according to the eighth embodiment of the present invention.

FIG. 14 is a block diagram of a phase lock circuit PS111 according to the prior art.

FIG. 24 is a circuit diagram showing an example of Schmitt trigger circuit.

FIG. 29 is a view showing waveforms of the primary parts of the phase lock circuit PS12 that is the twelfth embodiment of the present invention when it is in its locked state.

BEST MODES FOR CARRYING OUT THE INVENTION

Figure 1:
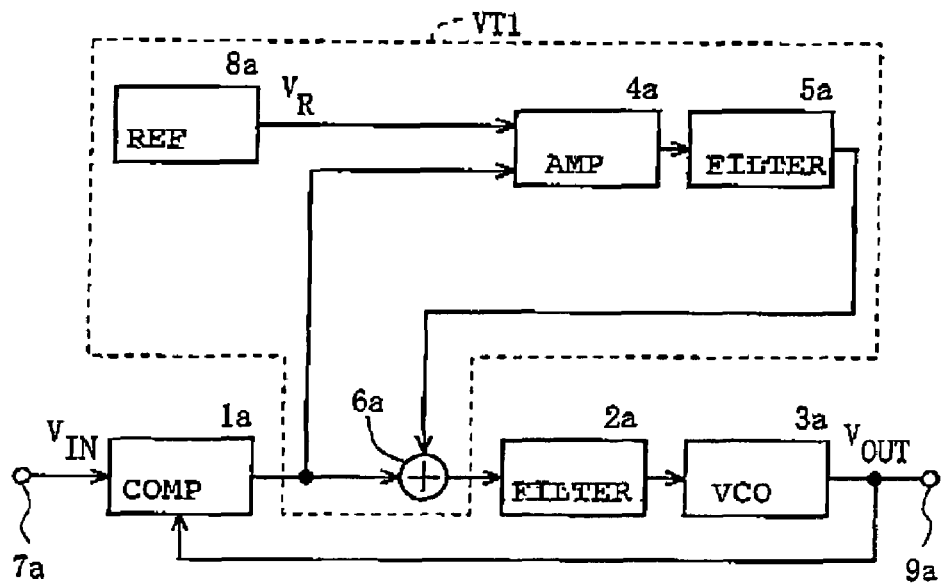
FIG. 1 is a block diagram of a phase lock circuit PS1 according to the first embodiment of the present invention.

FIG. 1 is a block diagram showing a phase lock circuit (phase-locked loop circuit) PS1 that is the first embodiment of the present invention in.

The phase lock circuit PS1 has a phase comparator $1a$, a loop filter $2a$, a voltage control oscillator(voltage-controlled oscillator) $3a$, a signal input terminal $7a$, a signal output terminal $9a$ and a voltage tracking circuit VT1 that is an additional loop. The phase comparator $1a$, loop filter $2a$ and voltage control oscillator $3a$ defines the main body of a phase lock circuit. The voltage tracking circuit VT1 comprises a reference voltage generator $8a$, a differential amplifier $4a$, a filter $5a$ and an adder $6a$. The phase comparator $1a$ will be described to be EXOR so long as it is not particularly declined below.

The differential amplifier $4a$ outputs a voltage proportional to a difference between the output voltage of the phase comparator $1a$ and the output voltage $V_R$ of the reference voltage generator $8a$. The filter $5a$ converts the output voltage of the differential amplifier $4a$ into DC voltage by integrating it. The result of integration is added to the output voltage of the phase comparator $1a$ through the adder $6a$.

The voltage tracking circuit VT1 controls the average output voltage of the phase comparator $1a$ so that it will coincide with the output voltage $V_R$ of the reference voltage generator $8a$. In other words, the polarity in the output signal of the differential amplifier $4a$ is inverted depending on the reference voltage $V_R$, thereby reversing the direction of change in the output voltage of the filter $5a$ (increase/decrease). More particularly, if the average output voltage of the phase comparator $1a$ exceeds the reference voltage $V_R$, the output signal of the differential amplifier $4a$ becomes negative while if the average output voltage of phase comparator $1a$ is less than the reference voltage $V_R$, the output signal of the differential amplifier $4a$ becomes positive. The output voltage of this differential amplifier $4a$ is converted into DC voltage by integrating it at the filter $5a$. Because the output voltage of the filter $5a$ is inputted into the voltage control oscillator $3a$, the average output voltage of the phase comparator $1a$ is drawn to the reference voltage $V_R$ whereat it is stable.

The fixation of the average voltage in the output signal of the phase comparator $1a$ to the reference voltage $V_R$ means that the phase difference between an input signal $7a$ ($V_{IN}$) into the phase comparator $1a$ and the output signal of the voltage control oscillator $3a$ is fixed.

Figure 2:
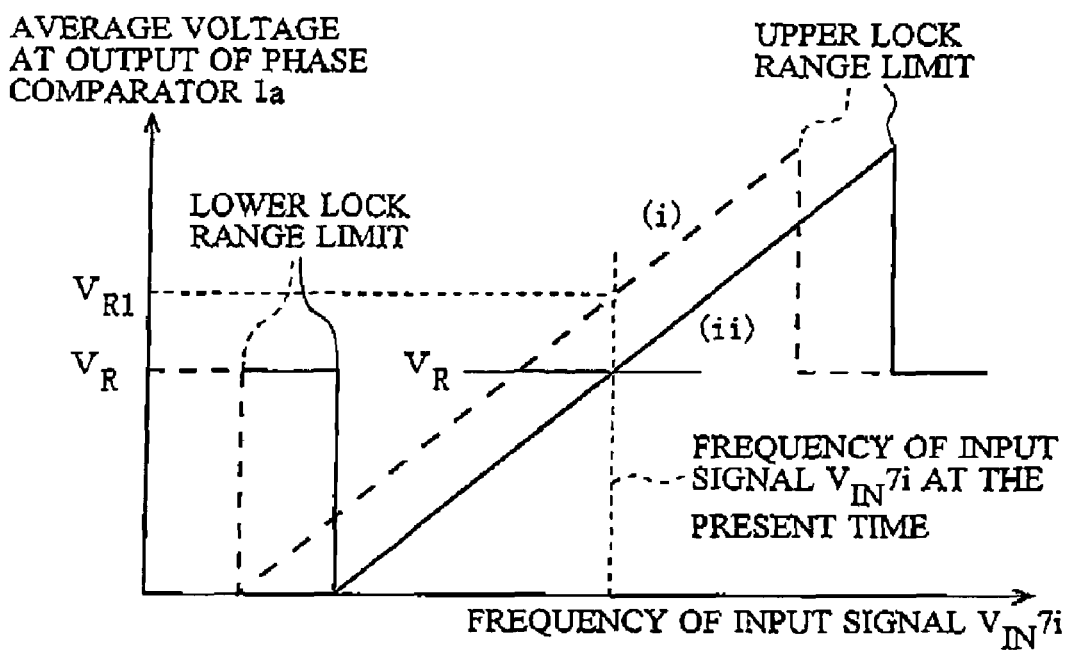
FIG. 2 illustrates the dependency of the average voltage in the output signal of a phase comparator 1a on the frequency of an input signal 7a ($V_{IN}$) when the phase lock circuit PS1 of the first embodiment is in its locked state.

FIG. 2 is a view showing the dependency of the average output signal of the phase comparator $1a$ on the frequency (or bit rate) of the input signal $7a$ ($V_{IN}$) when the phase lock circuit PS1 of the first embodiment is in its locked sate (or in a state wherein the frequency in the output signal of the phase lock circuit PS1 is stable).

It is assumed in FIG. 2 that the reference voltage $V_R$ generated by the reference voltage generator $8a$ is a fixed voltage corresponding to the middle of the lock range.

The average voltage of the reference voltage $V_R$ may exist within a range that the output voltage of the phase comparator $1a$ falls. Moreover, it is not necessary that the reference voltage $V_R$ is always a fixed voltage.

In Fig. 2, two straight lines shown by (i) and (ii) show characteristics for differential output voltages of the voltage tracking circuit VT1 (or differential output voltages of the filter $5a$).

Figure 3:
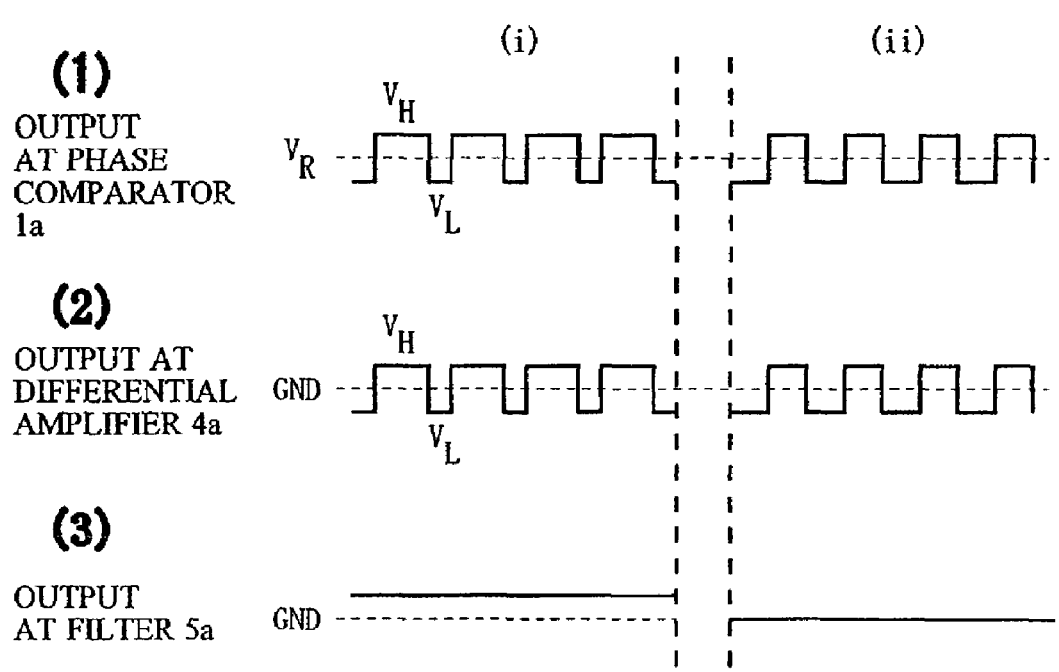
FIG. 3 shows signal waveforms in the primary parts of the phase lock circuit PS1 when signals having such characteristics (i) and (ii) as shown in FIG. 2 are inputted.

FIG. 3 is a view showing signal waveforms in the primary parts of the phase lock circuit PS1 when signals having such characteristics as shown by (i) and (ii) in FIG. 2 are inputted into the phase lock circuit PS1.

It is now assumed that the phase lock circuit is in the state shown by (i) in FIG. 2 immediately after it has shifted from its unlocked state to its locked state. Since the average output signal voltage $V_{R1}$ of the phase comparator $1a$ at the present frequency of the input signal $7a$ ($V_{IN}$) exceeds the reference voltage $V_R$, the time average output signal of the differential amplifier $4a$ will be offset from zero. Thus, the integrated voltage thereof occurs at the output of the filter $5a$.

In other words, when the relationship between the frequency of an input signal $V_{IN}7i$ and the average output voltage of the phase comparator $1a$ is as shown by (i) in FIG. 2, the frequency of the input signal is that of the input signal $V_{IN}7i$ at the present time (vertical dotted line). Therefore, the average voltage $V_{R1}$ corresponding to the intersection between two kinds of dotted lines becomes the average output voltage of the phase comparator $1a$. In the example of FIG. 2, the average voltage $V_{R1}$ is higher than the reference voltage $V_R$.

Since the average voltage $V_{R1}$ and reference voltage $V_R$ are separately determined, they will be different from each other immediately after the phase lock circuit has shifted to its locked state. The differential amplifier 4a amplifies the difference between both the voltages and outputs an value that is zero.

If the reference voltage $V_R$ can arbitrarily be determined and when the average output voltage of the phase comparator 1a exceeds the reference voltage $V_R$, this average output is determined by the phase difference between the two signals inputted into the phase comparator 1a. Therefore, whether the average output voltage of the phase comparator 1a is actually higher or lower than the reference voltage $V_R$ is determined depending on various factors such as free-run frequency at the voltage control oscillator 3a or the like.

On the other hand, the output voltage of the filter 5a is applied to the voltage control oscillator 3a as offset voltage through the adder 6a. Because this offset voltage works to control the feed back, the output voltage of the filter 5a approaches the characteristic shown by (ii) in FIG. 2. As the output voltage reaches the characteristic (ii), the average output voltage of the phase comparator 1a coincides with the reference voltage $V_R$. Thus, the time average output signal of the differential amplifier 4a becomes zero and the output voltage of the filter 5a is fixed and maintained stable.

In FIGS. 2 and 3, the duty ratio in the output voltage of the phase comparator 1a is kept at a value near 50% since the reference voltage $V_R$ is selected to be at the middle of the lock range. If the reference voltage $V_R$ is selected to be lower than the middle of the lock range, the duty ratio in the output voltage of the phase comparator 1a is kept at a value smaller than the above value. On the contrary, if the reference voltage $V_R$ is selected as a voltage higher than the middle of the lock range, the duty ratio in the output voltage of the phase comparator 1a is kept at a value higher than the above value.

In the phase lock circuit PS1, the voltage tracking circuit VT1 performs the feedback control to maintain the duty ratio of the output voltage of the phase comparator 1a. In comparison with a phase lock circuit having no voltage tracking circuit VT1, the phase lock circuit PS1 will have its greatly enlarged lock range. By maintaining the duty ratio of the phase comparator 1a constant, the lock range is enlarged so that the value of the duty ratio itself is not relevant to the enlargement of lock range. In other words, it is necessary for the average voltage of the reference voltage $V_R$ to be within a range that the output voltage of the phase comparator 1a can fall, but the lock range is enlarged insofar as the reference voltage $V_R$ falls within that range, irrespectively of the value of the reference voltage $V_R$ itself.

Although the description has been made as to the phase comparator being EXOR, the enlargement of lock range can similarly be provided even if the phase comparator is in the form of an analog mixer or set/reset flip flop. In application to CDR, the phase comparator may be of a type containing a discrimination circuit (see C. R. Hogge, JR., "A Self Correcting Clock Recovery Circuit", Journal of Lightwave Tech., vol. LT-3, No.6, 1985, P1323 and Japanese Patent Laid-Open No. 2000-68991). Furthermore, the phase comparator may be a so-called Bang-bang type phase comparator (BB-PD) employing a delay flip flop (D-FF). When the BB-PD is used and if a drift occurs in the oscillatory frequency of voltage control oscillator, the duty ratio of the BB-PD output varies to maintain the lock even if a voltage tracking circuit is not used, although the phase relationship between the input signal and the voltage control oscillator output. At this time, the range of frequency in which the duty ratio of the BB-PD output can vary is the lock range. The addition of the voltage tracking circuit can fix the duty ratio of BB-PD output (e.g., to 50%). Thus, the lock range can broadly be enlarged. In addition, even if the phase comparator is in the form of a phase frequency comparator (PFD), the lock range can be enlarged as described.

The lock range can be enlarged when the voltage tracking circuit VT1 is applied to the phase lock circuit including the additional retraction circuit. When the phase lock circuit is shifted from its unlocked state to its locked state under action of the retraction circuit and if the duty ratio in the output voltage of the phase comparator 1a is substantially equal to zero or even substantially equal to 100% (i.e., the retraction occurs at one end of the lock range) at this point, the voltage tracking circuit VT1 can operate to draw the duty ratio to a predetermined level and also to maintain it.

In place of the additional voltage tracking circuit, a low-pass filter or integrator having its time constant longer than that of the loop filter may be added parallel to the loop filter. This can provide a slight enlargement of lock range. However, such a method cannot arbitrarily select the output duty ratio of the phase comparator and also a sufficient advantage due to the enlargement of lock range.

The phase lock circuit of the first embodiment can provide an broader rock range and maintain the lock in any phase (which is optimum for jitter yield strength or the like) since the drift in the oscillation frequency of the voltage control oscillator is compensated by performing such a control that the average output voltage of the phase comparator coincides with any reference voltage while maintaining the average output voltage of the phase comparator at any voltage.

Since the phase lock circuit of the first embodiment can arbitrarily select any duty ratio of the phase comparator, the reference voltage can be changed depending on variation of the input data pattern or input signal level. Thus, the optimal operation for the jitter yield strength can be realized under any of various conditions.

The loop filter 2a in the first embodiment may be a passive lag lead filter having a passive element or an active lag lead filter using an active element. Generally, the phase lock circuit employing the passive lag lead filter has its lock range narrower than that of the phase lock circuit employing the active lag lead filter. Therefore, if the voltage tracking circuit VT1 of the first embodiment is applied to the phase lock circuit employing the passive lag lead filter, the enlargement of lock range will particularly be prominently advantageous. In other words, if the aforementioned voltage tracking circuit VT1 is applied to the conventional phase lock circuit using the active lag lead filter, the phase lock circuit can use the passive lag lead filter reduced in circuit scale and simplified in design, in place of the active lag lead filter.

Figure 4:
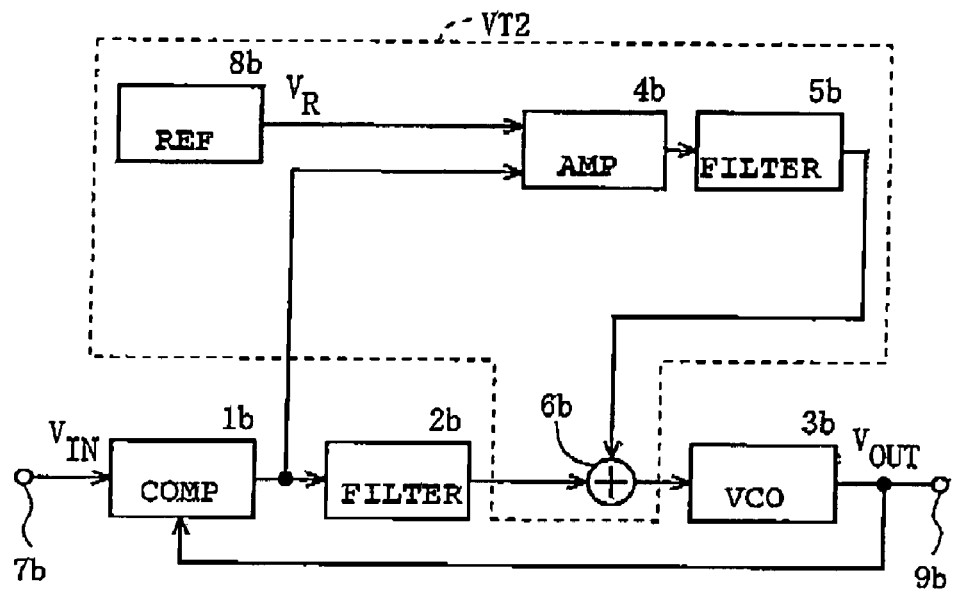
FIG. 4 is a block diagram of another phase lock circuit PS2 according to the second embodiment of the present invention.

FIG. 4 is a block diagram showing a phase lock circuit PS2 that is the second embodiment of the present invention.

The phase lock circuit PS2 comprises a phase comparator 1b, a loop filter 2b, a voltage control oscillator 3b, a signal input terminal 7b, a signal output terminal 9b, and a voltage tracking circuit VT2. The voltage tracking circuit VT2 comprises a reference voltage generator 8b, a differential amplifier 4b, a filter 5b and an adder 6b.

The phase lock circuit PS2 is basically the same as the phase lock circuit PS1, except that the output voltage of the filter 5b is added to the output voltage of the loop filter 2b rather than to the output voltage of the phase comparator 1b.

Operation and advantage in the phase lock circuit PS2 are substantially the same as those of the phase lock circuit PS1.

Figure 5:
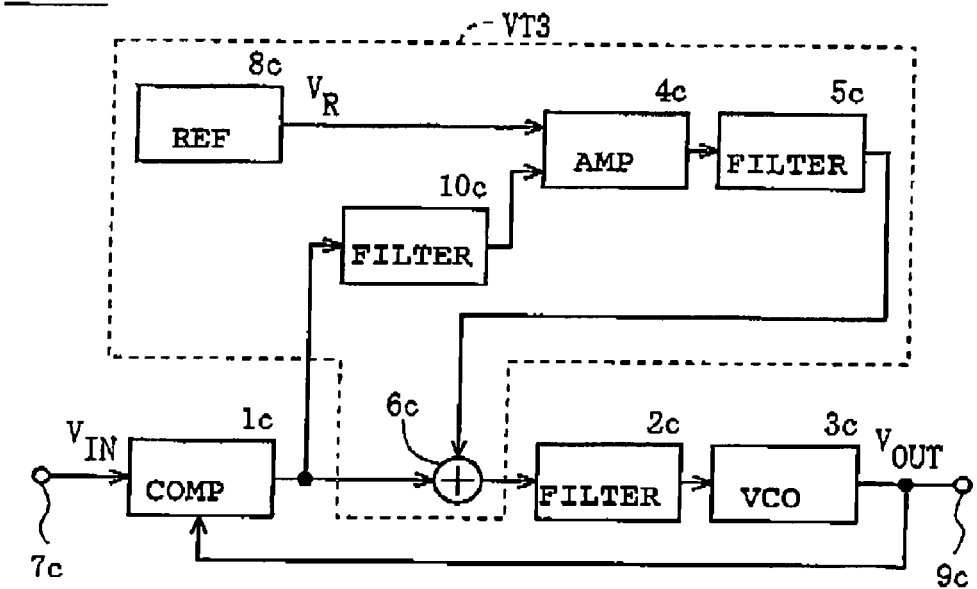
FIG. 5 is a block diagram of still another phase lock circuit PS3 according to the third embodiment of the present invention.

FIG. 5 is a block diagram showing a phase lock circuit PS3 that is the third embodiment of the present invention.

The phase lock circuit PS3 has a phase comparator 1c, a loop filter 2c, a voltage control oscillator 3c, a signal input terminal 7c, a signal output terminal 9c and a voltage tracking circuit VT3. The voltage tracking circuit VT3 comprises a reference voltage generator 8c, a differential amplifier 4c, a first filter 10c, a second filter 5c and an adder 6c.

Figure 6:
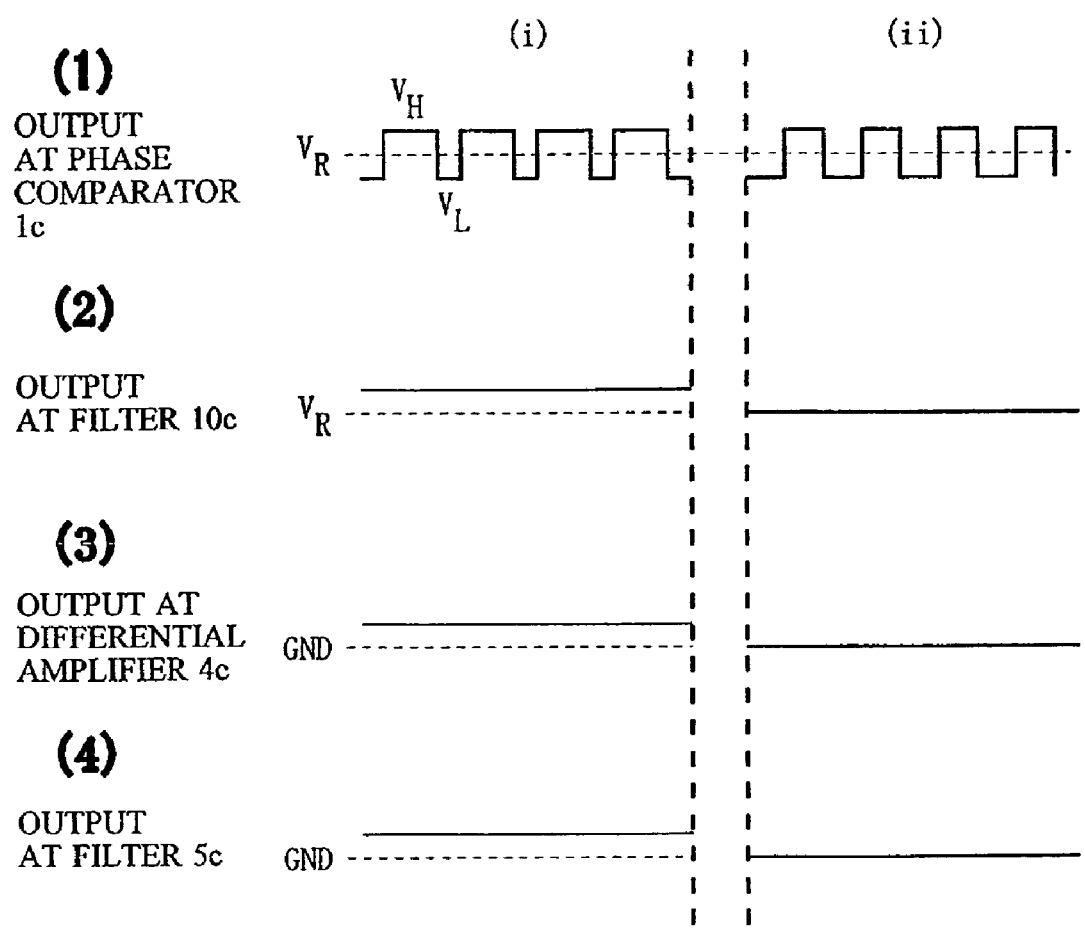
FIG. 6 shows signal waveforms in the primary parts of the phase lock circuit PS3.

FIG. 6 is a view showing signal waveforms in the primary parts of the phase lock circuit PS3.

FIG. 6(i) is a view showing the operation of the phase lock circuit immediately after it has been shifted from its unlocked state to its locked state while FIG. 6 (ii) shows such a sate that the duty ratio in the output of the phase comparator 1c is maintained constant (about 50% in FIG. 6) by the voltage tracking circuit VT3.

The operational principle and advantage of the phase lock circuit PS3 are substantially the same as those of the phase lock circuits PS1 and PS2 except that the phase lock circuit PS3 includes the filter 10c inserted thereinto to provide two DC signal from the differential amplifier 4c. Thus, the speed of computation in the differential amplifier 4c can be reduced to lower the power consumption in comparison with the phase lock circuits PS1 and PS2.

Figure 7:
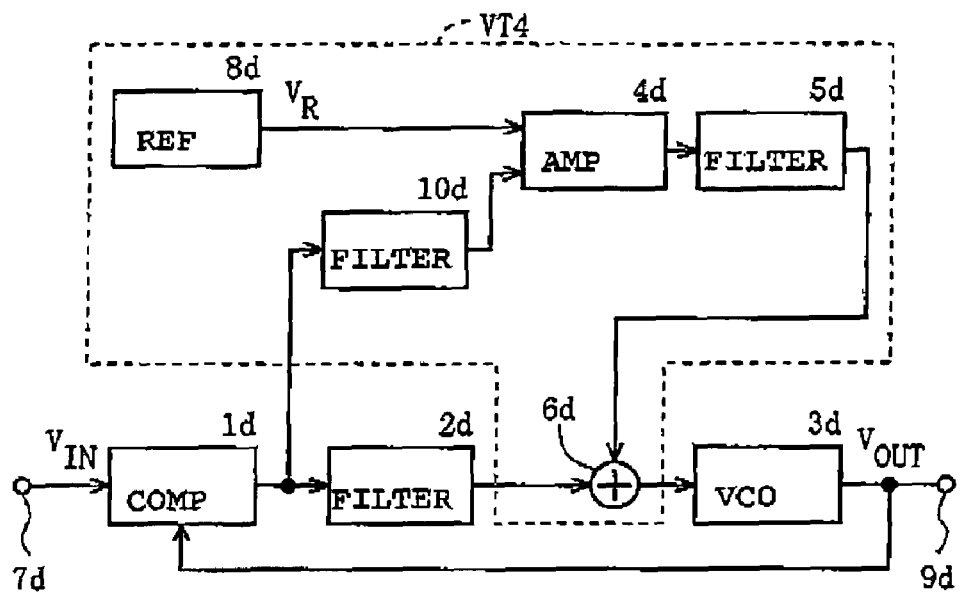
FIG. 7 is a block diagram of still another phase lock circuit PS4 according to the fourth embodiment of the present invention.

FIG. 7 is a block diagram showing a phase lock circuit PS4 that is the fourth embodiment of the present invention.

The phase lock circuit PS4 has a phase comparator 1d, a loop filter 2d, a voltage control oscillator 3d, a signal input terminal 7d, a signal output terminal 9d and a voltage tracking circuit VT4. The voltage tracking circuit VT4 comprises a reference voltage generator 8d, a differential amplifier 4d, a first filter 10d, a second filter 5d and an adder 6d.

The phase lock circuit PS4 is basically the same as the phase lock circuit PS3 except that the output voltage of the filter 5d is added to the output voltage of the loop filter 2d rather than the output voltage of the phase comparator 1d.

The operation and advantage of the phase lock circuit PS4 are substantially the same as those of the phase lock circuit PS3.

Figure 8:
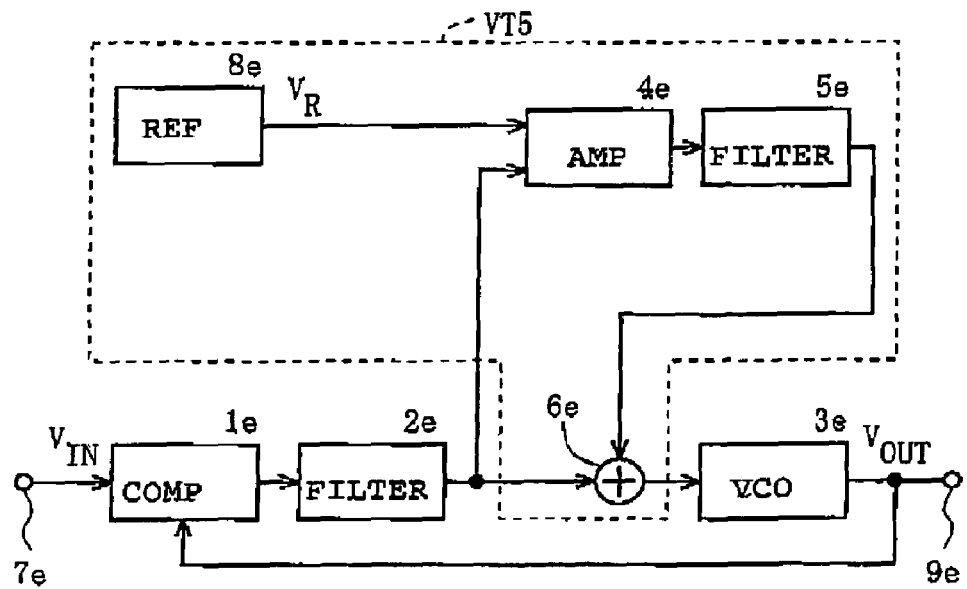
FIG. 8 is a block diagram of still another phase lock circuit PS5 according to the fifth embodiment of the present invention.

FIG. 8 is a block diagram showing a phase lock circuit PS5 that is the fifth embodiment of the present invention.

The phase lock circuit PS5 has a phase comparator 1e, a loop filter 2e, a voltage control oscillator 3e, a signal input terminal 7e, a signal output terminal 9e and a voltage tracking circuit VT5. The voltage tracking circuit VT5 comprises a reference voltage generator 8e, a differential amplifier 4e, a filter 5e and an adder 6e.

The phase lock circuit PS5 realizes the functions of the first filter 10d and loop filter 2d in the phase lock circuit PS4 through a single filter (filter 2e). Therefore, the phase lock circuit PS5 has its reduced circuit scale smaller than that of the phase lock circuit PS4.

Figure 9:
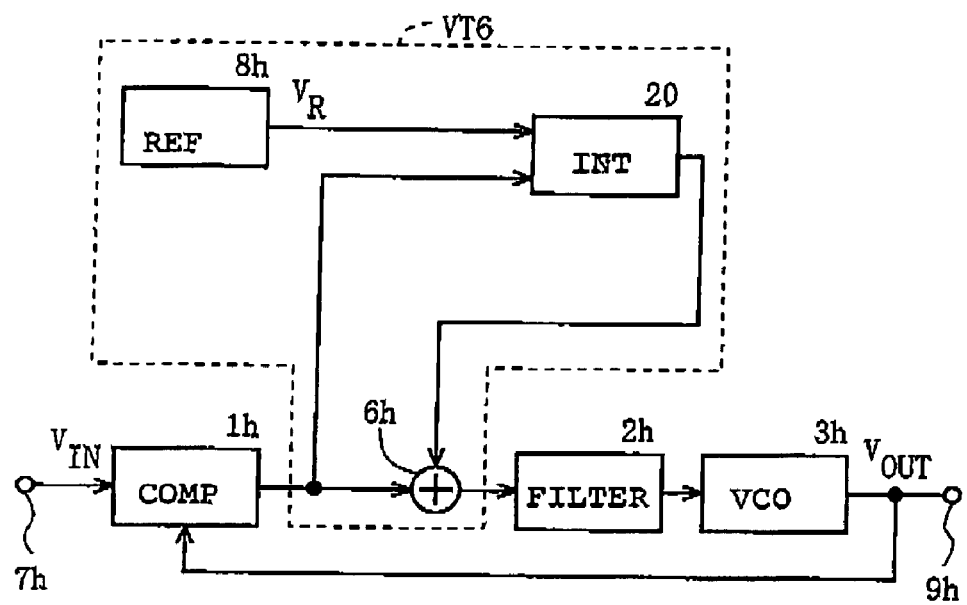
FIG. 9 is a block diagram of still another phase lock circuit PS6 according to the sixth embodiment of the present invention.

FIG. 9 is a block diagram showing a phase lock circuit PS6 that is the sixth embodiment of the present invention.

The phase lock circuit PS6 has a phase comparator 1h, a loop filter 2h, a voltage control oscillator 3h, a signal input terminal 7h, a signal output terminal 9h and a voltage tracking circuit VT6. The voltage tracking circuit VT6 comprises a reference voltage generator 8h, a differential integrator 20 and an adder 6h.

The phase lock circuit PS6 is realized by the differential integrator 20 that is a single circuit, instead of the differential amplifier 4a and filter 5a in the phase lock circuit PS1. Therefore, the phase lock circuit PS6 has its reduced circuit scale smaller than those of the phase lock circuits PS1–PS5.

In each of the phase lock circuits PS2–PS5, the differential amplifier and filter may be replaced by a single differential integrator.

Figure 10:
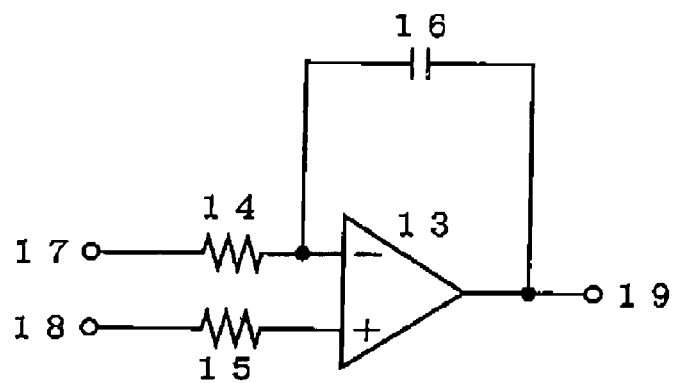
FIG. 10 is a circuit diagram of a differential integrator.

FIG. 10 is a circuit diagram exemplifying a configuration of the differential integrator 20.

The differential integrator 20 has an operational amplifier 13, resistors 14, 15, a capacity 16, input terminals 17, 18 and an output terminal 19. The differential integrator 20 is adapted to integrate a difference between two voltages inputted into the input terminals 17 and 18 and to output the result toward the output terminal 19 as a voltage.

Figure 11:
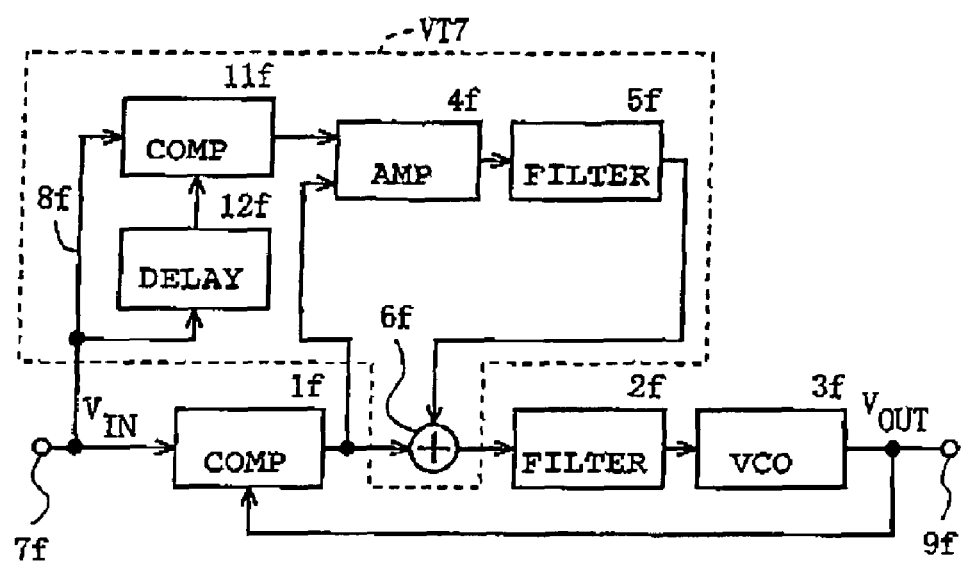
FIG. 11 is a block diagram of still another phase lock circuit PS7 according to the seventh embodiment of the present invention.
Figure 1:
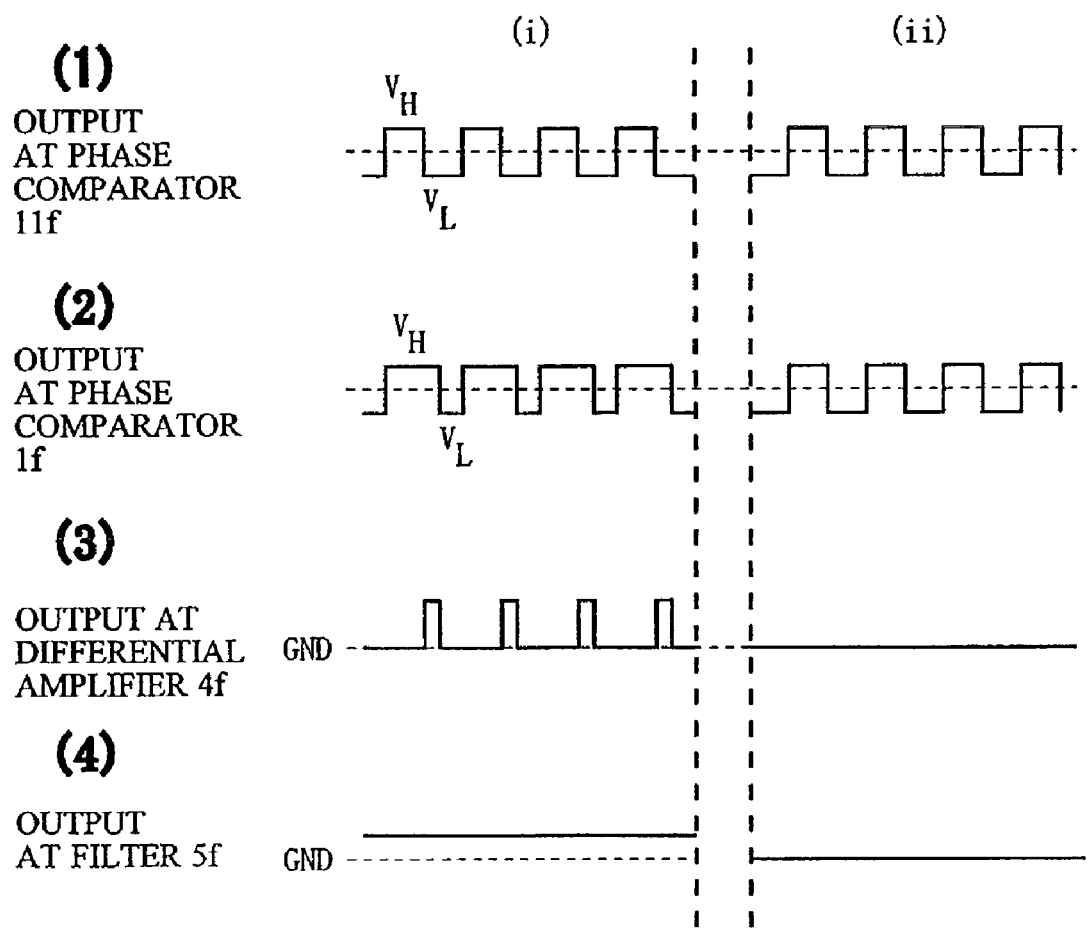
Figure 1:
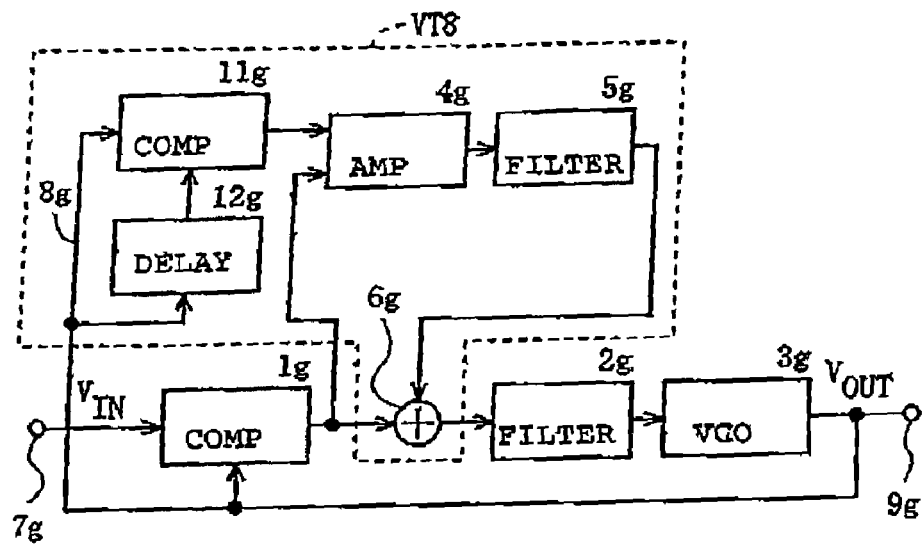
Figure 1:
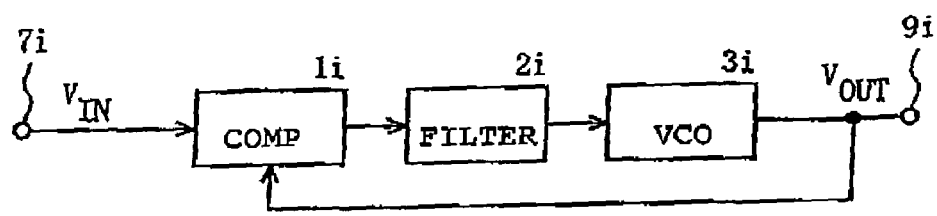
Figure 15:
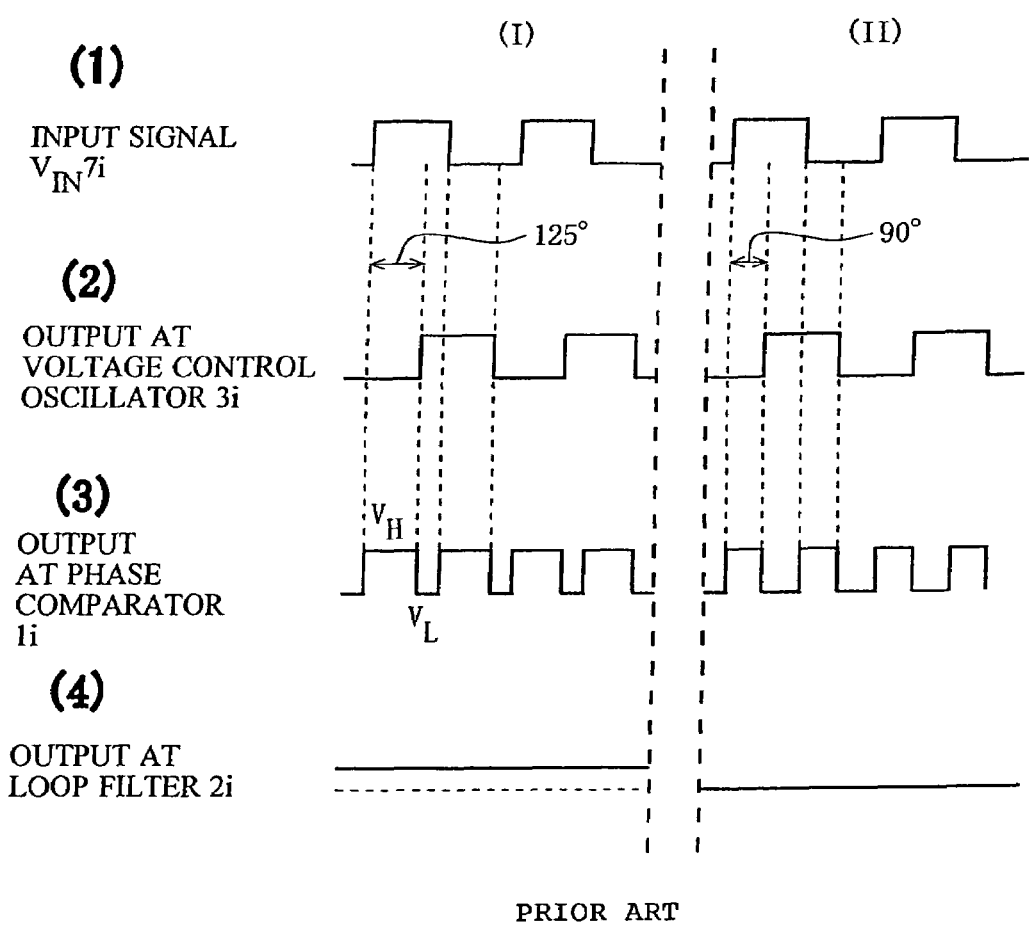
FIG. 15 is a time chart illustrating the operation of the phase lock circuit PS111 shown in FIG. 14.
Figure 16:
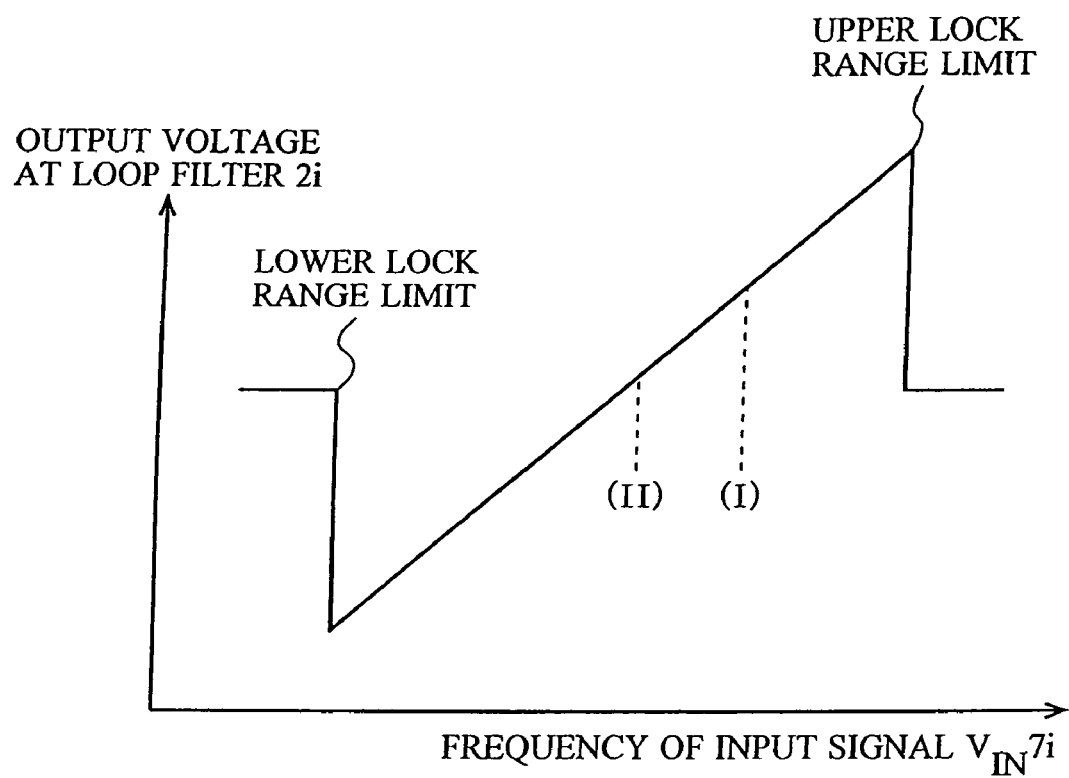
FIG. 16 illustrates changes in the output voltage of the loop filter 2i when the frequency (or bit rate) of the input signal 7i ($V_{IN}$) is varied.

FIG. 11 is a block diagram showing a phase lock circuit PS7 that is the seventh embodiment of the present invention.

The phase lock circuit PS7 has a phase comparator 1f, a loop filter 2f, a voltage control oscillator 3f, a voltage tracking circuit VT7, an adder 6f, a signal input terminal 7f and a signal output terminal 9f.

The voltage tracking circuit VT7 comprises a phase comparator 11f, a delay generator 12f, a differential amplifier 4f, a filter 5f and an adder 6f. The phase comparator 11f and delay generator 12f define a reference voltage generator.

FIG. 12 is a view showing waveforms of the primary parts of the phase lock circuit PS7. FIG. 12(i) is a view showing a state immediately after the phase lock circuit PS7 has been shifted from its unlocked state to its locked state while FIG. 12 (ii) shows a state in which the duty ratio in the output of the phase comparator 1f coincides with that of the phase comparator 11f (about 50% in FIG. 12) under action of the voltage tracking circuit VT7.

FIG. 12 shows the delay generator 12f as one for generating a delay corresponding to 90 phase and waveforms in a case where the phase comparator 11 is formed of EXOR. Since the phase comparator 11f receives an input signal 7f ($V_{IN}$) and a signal delayed from this input signal by 90 it will output such a rectangular waveform having its duty ratio of 50% as shown in FIG. 12 (1). Thus, the average voltage in the output signal of the phase comparator 11f coincides with the average voltage at the output signal of the phase comparator 11f will have the duty ratio of 50%. Therefore, the phase lock circuit PS7 uses the output signal of the phase comparator 11f as the reference voltage $V_R$.

Although FIG. 12 shows both the outputs of the phase comparators 11f and 1f to be pulse-shaped, these output signals may be converted into DC signals by insertion of filters into the respective inputs of the differential amplifier 4f, the DC signals being then inputted into the differential amplifier 4f.

The phase lock circuit PS7 clearly shows the embodiment of each of the reference voltage generator in the phase lock circuits PS1–PS6 and can eliminate the adjustment of the reference voltage $V_R$ by causing the phase comparator 11f and delay generator 12f to generate the reference voltage $V_R$.

FIG. 13 is a block diagram showing a phase lock circuit PS8 that is the eighth embodiment of the present invention.

The phase lock circuit PS8 has a phase comparator 1g, a loop filter 2g, a voltage control oscillator 3g, a voltage tracking circuit VT8, an adder 6g, a signal input terminal 7g and a signal output terminal 9g.

The voltage tracking circuit VT8 comprises a phase comparator 11g, a delay generator 12g, a differential amplifier 4g, a filter 5g and an adder 6g. The phase comparator 11g and delay generator 12g define a reference voltage generator.

The phase lock circuit PS8 generates a reference voltage in a manner different from that of the phase lock circuit PS7. Although the phase lock circuit PS7 uses the input signal 7f ($V_{IN}$) as the input signal into the phase comparator 11f and delay generator 12f, the phase lock circuit PS8 uses the output signal of the voltage control oscillator 3g as the input signal into the phase comparator 11g and delay generator 12g.

Since the phase lock circuit PS8 uses the output signal of the voltage control oscillator 3g as the input signal into the phase comparator 11g and delay generator 12g, it can stably generate the reference voltage $V_R$ without influence from the amplitude of the input signal 7g ($V_{IN}$).

The most primary feature in the eighth embodiments is to add the voltage tracking circuit to the phase lock circuit. The voltage tracking circuit performs the control for providing an offset voltage to the voltage control oscillator such that the phase difference between the input signal and the output voltage of the voltage control oscillator (that is, to maintain the duty ratio of the phase comparator output constant).

By the way, the following embodiment provides a phase lock circuit having a signal path to which a phase comparator, loop filter, voltage control oscillator and lock detector are connected in series, the phase lock circuit further comprising voltage tracking circuit for adding a signal for causing the average output voltage of the phase comparator to coincide with a predetermined reference voltage to the voltage of said signal path. The lock range of the phase lock circuit is enlarged by the signal added by said voltage tracking circuit.

Figure 19:
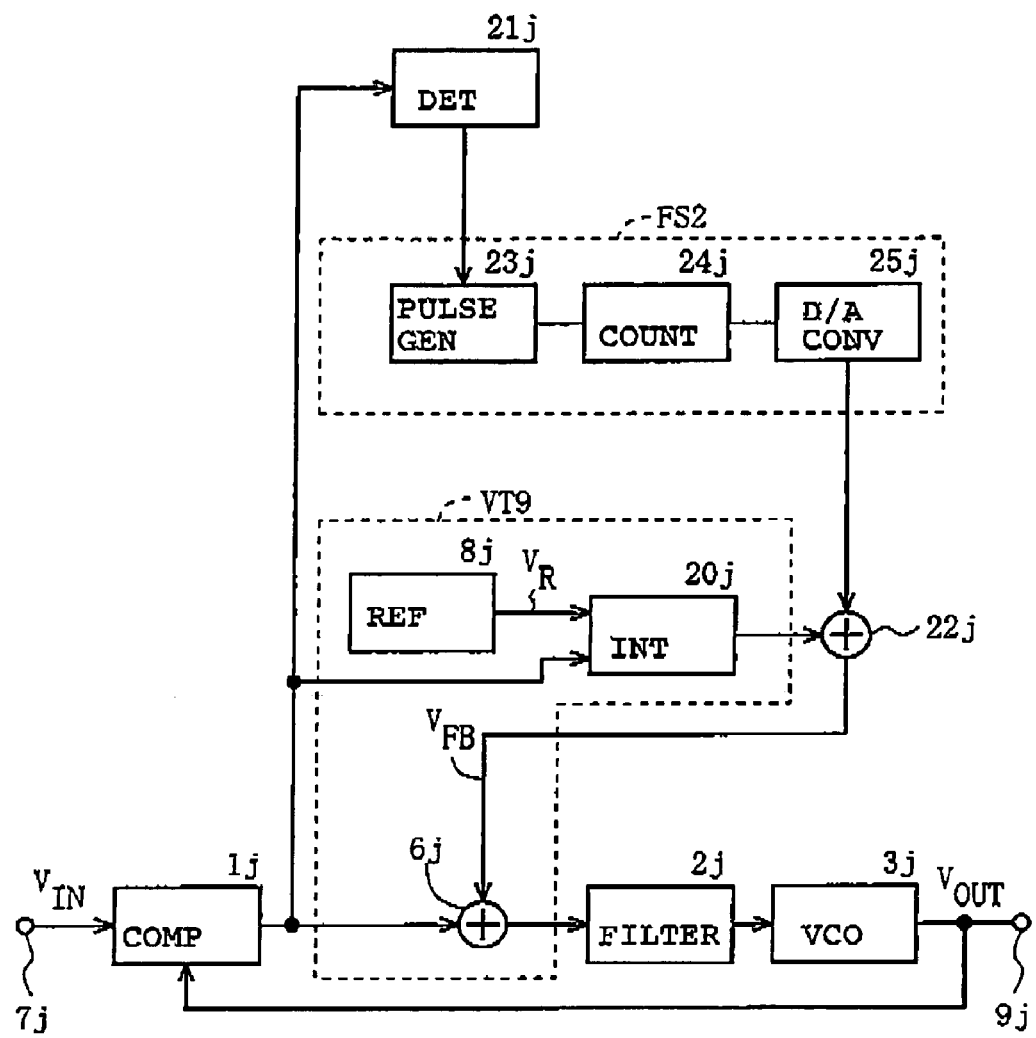
FIG. 19 is a block diagram showing a phase lock circuit PS9 which is the ninth embodiment of the present invention.

FIG. 19 is a block diagram showing a phase lock circuit PS9 that is the ninth embodiment of the present invention.

The phase lock circuit PS9 has a phase comparator 1j, a loop filter 2j, a voltage control oscillator 3j, a signal input terminal 7j, a signal output terminal 9j, a lock detector 21j, a retraction circuit FS2 that is an additional loop, and a voltage tracking circuit VT9 that is another additional loop.

The phase comparator 1j, loop filter 2j and voltage control oscillator 3j define the main body of the phase lock circuit. The retraction circuit FS2 comprises a pulse generator 23j, a counting circuit 24j and a D/A converter 25j. The voltage tracking circuit VT9 comprises a reference voltage generator 8j, a differential integrator 20j and an adder 6j.

Figure 20:
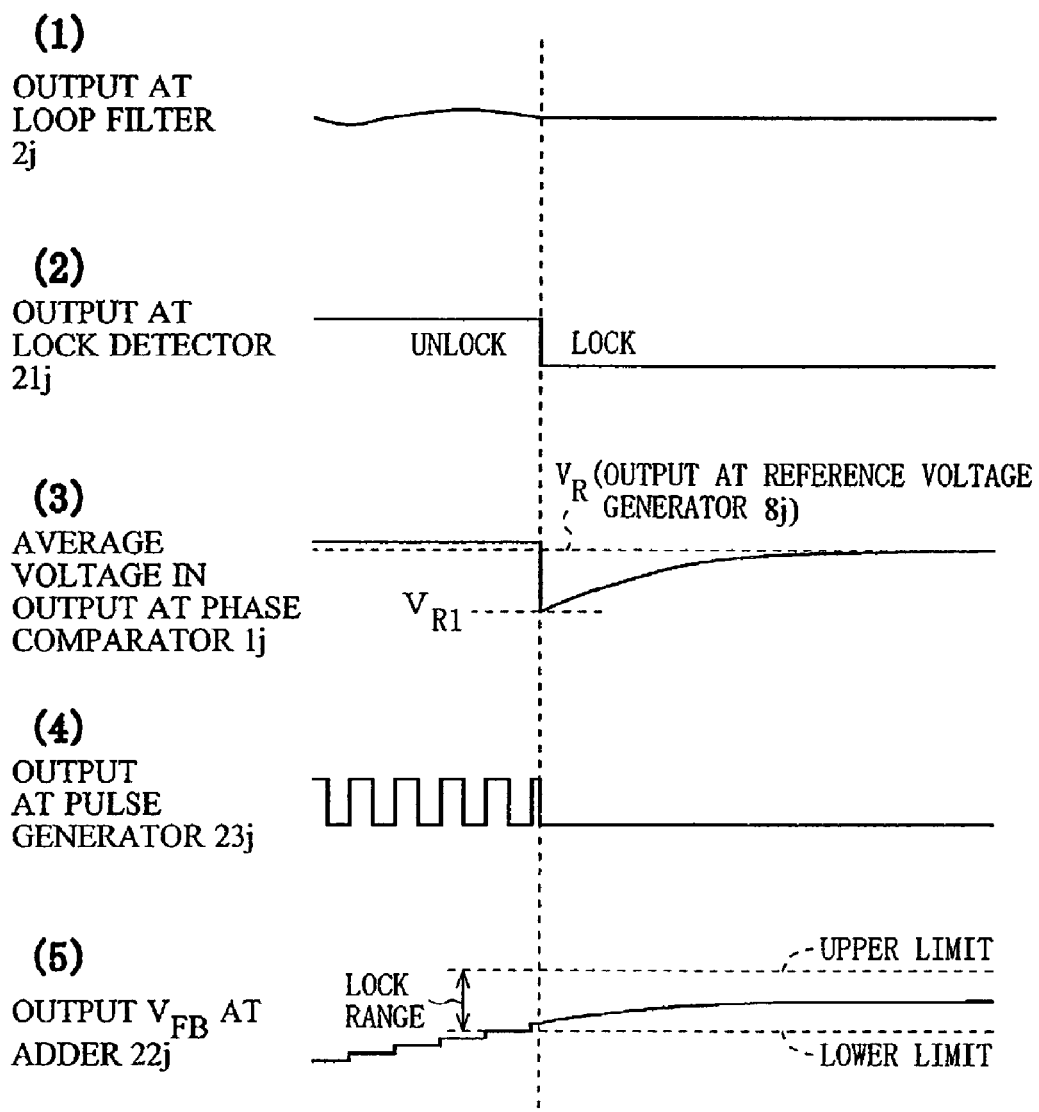
FIG. 20 is a view showing waveforms of the primary parts of the phase lock circuit PS9.

FIG. 20 is a view showing waveforms in the primary parts of the phase lock circuit PS9.

FIG. 20 (1) shows an output signal waveform of the loop filter 2j; FIG. 20 (2) shows an output signal waveform of the lock detecting element 21j; FIG. 20 (3) shows the average voltage in an output signal of the phase comparator 1j; FIG. 20 (4) shows an output signal waveform of the pulse generator 23j; and FIG. 20 (5) shows an output signal $V_{FB}$ of the adder 22j. FIG. 20 (3) also shows the level of the output voltage $V_R$ in the reference voltage generator 8j.

At the initial stage (left side about a dotted line) of the timing diagram, the phase lock circuit is shown in its unlocked state (or a state in which the output signal of the voltage control oscillator is asynchronous with the input signal $V_{IN}$). The unlocked state of the phase lock circuit is detected by the lock detector 21j and the pulse generator 23j generates pulses. In association with this, the counting circuit 24j varies its count. The output voltage of the counting circuit 24j is stepwise varied by the D/A converter 25j. The output voltage of the D/A converter 25j varies the oscillation frequency of the voltage control oscillator 3j. At the time when the oscillation frequency approaches the frequency of the input signal, the phase lock circuit is retracted. Therefore, the lock detector 21j detects the lock; the pulse generator 23j stops; the counting circuit 24j maintains its count constant; and the D/A converter 25j maintains its output voltage constant. Thus, the phase lock circuit is held at its locked state (or a state in which the output signal of the voltage control oscillator is synchronous with the input signal $V_{IN}$). As a result, the pull-in range can be enlarged to a range in which the voltage control oscillator 3j can vary its oscillation frequency. Such a process is the same as those of the aforementioned embodiments.

At the time when the phase lock circuit has been shifted from its unlocked state to its locked state, the output voltage $V_{FB}$ of the adder 22j is not necessarily at a position near the center of the lock range, but may is at a position near the lower (or upper) limit in the lock range, as shown in FIG. 20 (5). The voltage tracking circuit VT9 causes the output voltage of the adder 22j after the lock to shift to a desired voltage (e.g., a voltage near the center of the lock range).

The operation of the voltage tracking circuit VT9 will be described in detail.

Figure 21:
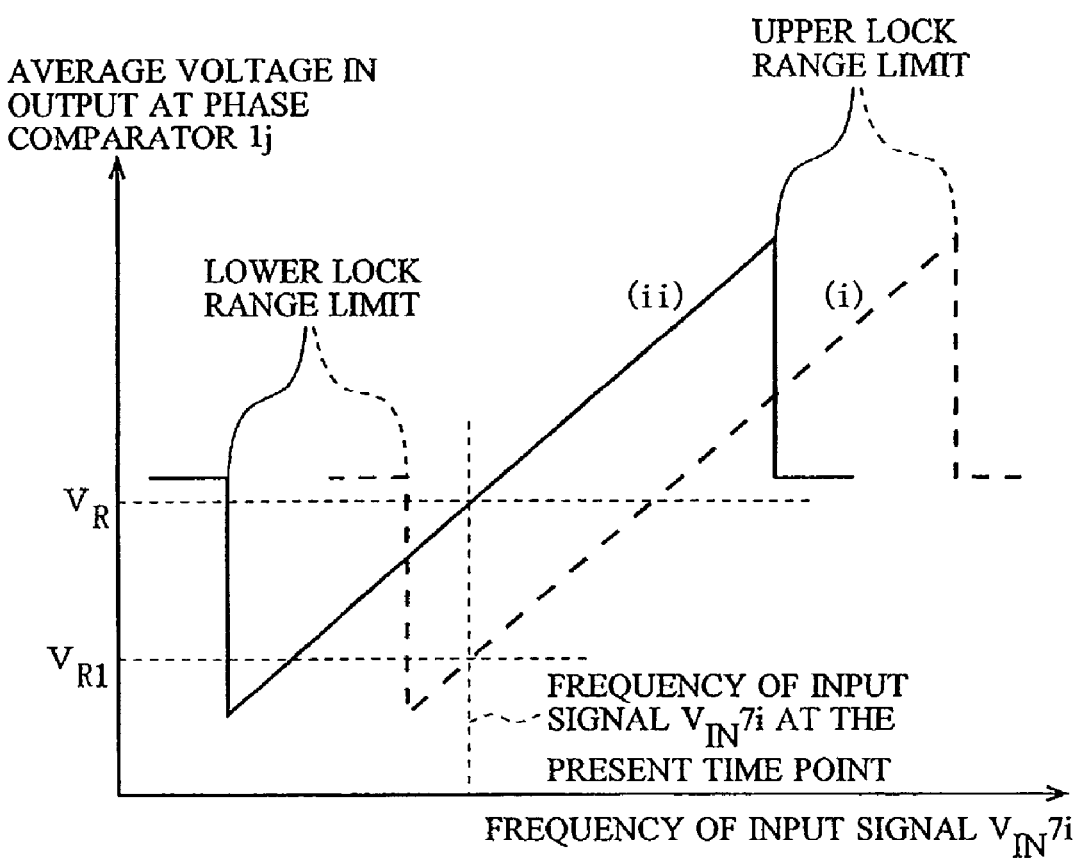
FIG. 21 is a view showing the relationship between the frequency of an input signal $V_{IN}7j$ and the average voltage of the phase comparator $1j$ in the phase lock circuit PS9.

FIG. 21 is a view showing the relationship between the frequency of the input signal $V_{IN}7j$ and the average voltage of the phase comparator 1j in the phase lock circuit PS9.

In FIG. 21, (i) shows the characteristic of the phase lock circuit at the time when it has shifted from its unlocked state to its locked state. At this time, the average voltage in the output signal of the phase comparator 1j at the frequency of the input signal $V_{IN}7j$ is $V_{R1}$ which is near the lower limit in the voltage range in which the average voltage in the output signal of the phase comparator 1j can fall. In such a state, the locked state cannot stably be held against the environmental variation such as supply voltage variation, temperature change, jitter input or the like.

The voltage tracking circuit VT9 receives inputs $V_R$ and $V_{R1}$ and integrates a voltage proportional to the difference between these inputs, the result being then fed to the adder 22j. As a result, the output frequency of the voltage control oscillator 3j slightly varies to change the phase relationship between the input signal $V_{IN}7j$ and the output signal of the voltage control oscillator 3j. The average voltage in the output signal of the phase comparator 1j approaches $V_R$. As the average voltage coincides with $V_R$, it will be stable (FIG. 20 (3)).

The relationship between the frequency of the input signal $V_{IN}7j$ and the average voltage of the phase comparator 1j after been stable is shown in FIG. 21 at (ii). At this time, the average voltage in the output of the phase comparator 1j at the frequency of the input signal $V_{IN}7j$ is $V_R$.

When the output voltage $V_R$ of the reference voltage generator 8j is set to be near the center of the voltage range which the average voltage in the output of the phase comparator 1j can take (FIG. 21), the output voltage $V_{FB}$ of the adder 22j can be moved to a point near the center of the lock range and held at that point. In such a manner, the phase lock circuit can stably be kept at its locked state against the environmental variation such as supply voltage variation, temperature change, jitter input or the like, irrespectively of the output voltage of the adder 22j at the time when the phase lock circuit is shifted from its unlocked state to its locked state.

In the phase lock circuit PS9, moreover, the voltage tracking circuit VT9 can enlarge the lock range in addition to the enlargement of the pull-in range by the retraction circuit FS2 and the stable keeping of the locked state against the environmental variation by the voltage tracking circuit VT9.

Figure 22:
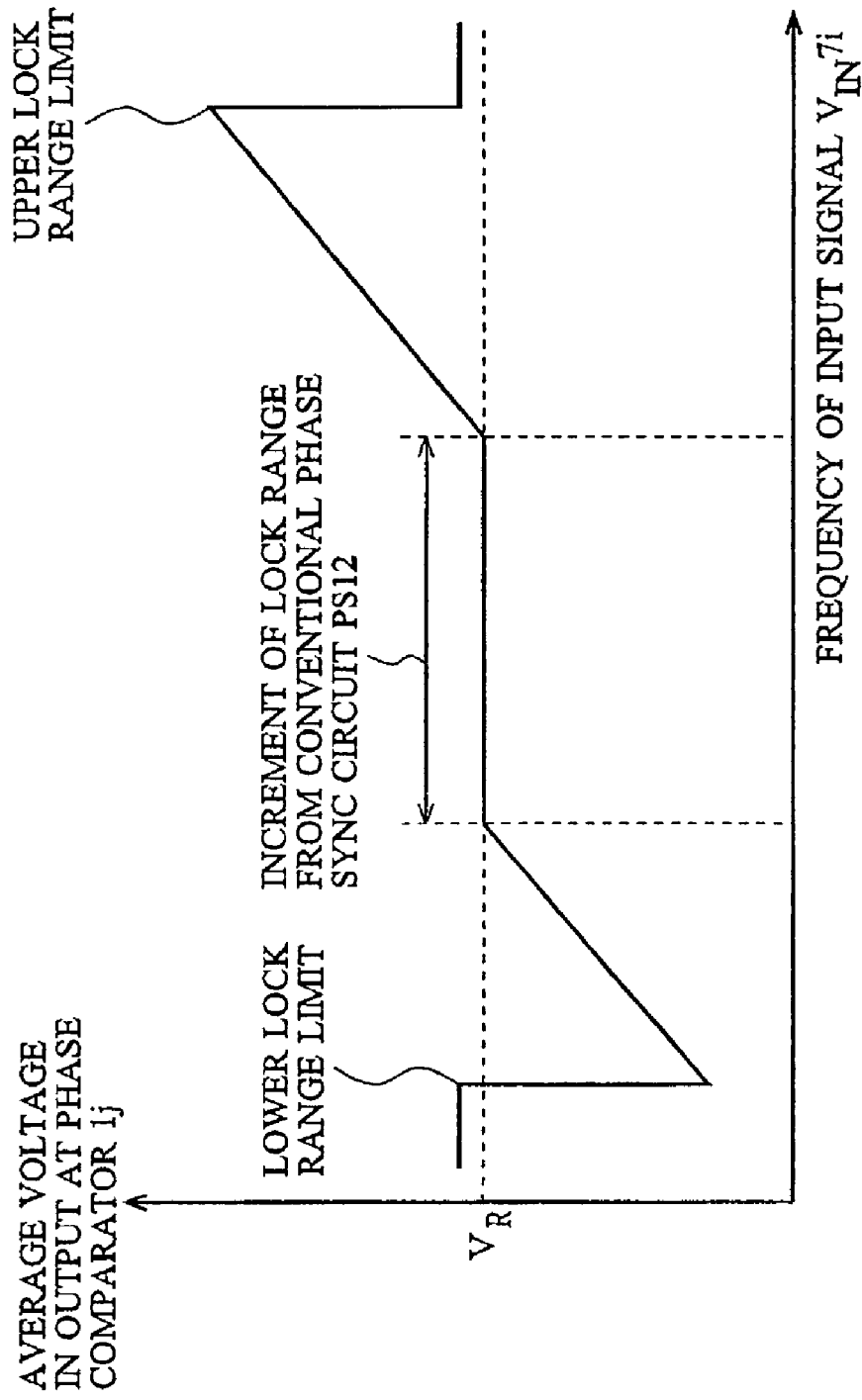
FIG. 22 is a view showing the relationship between the frequency of the input signal $V_{IN}7j$ and the average voltage of phase comparator $1j$ after the voltage tracking circuit VT9 has been stable.

FIG. 22 is a view showing the relationship between the frequency of the input signal $V_{IN}7j$ and the average voltage of the phase comparator 1j after the voltage tracking circuit VT9 has been stabilized.

The retraction circuit FS2 enlarges the range of the input frequency $V_{IN}7jin$ in which the phase lock circuit can be shifted from its unlocked state to its locked state. Thereafter, the voltage tracking circuit V19 causes the average voltage in the output signal of the phase comparator 1j to coincide with the output voltage $V_R$ of the reference voltage generator 8j. This coincidence can be kept to hold the locked state even if the frequency (or bit rate) of the input signal $V_{IN}7j$ varies. Therefore, the lock range will be enlarged.

In comparison of the phase lock circuit PS9 with the conventional phase lock circuit PS112, the central part of FIG. 22, that is, the frequency range of the input signal $V_{IN}7j$ in which the average voltage in the output signal of the phase comparator 1j coincides with the output voltage $V_R$ of the reference voltage generator 8j is an increase on the lock range by addition of the voltage tracking circuit VT9. This increase on the lock range can arbitrarily be selected by varying the output voltage ranges of the retraction circuit FS2 and voltage tracking circuit V19, independently of the characteristic of the loop filter 2j. In other words, the lock range can be enlarged without deterioration of the phase noise and jitter yield strength in the output of the phase lock circuit.

If it is simply wanted to enlarge the lock range, the output voltage $V_R$ of the reference voltage generator 8j may be set in the voltage range that the average voltage in the output of the phase comparator 1j can be taken. Thus, the lock range can be enlarged irrespectively of its set value. Furthermore, if the output voltage $V_R$ of the reference voltage generator 8j is set at a point near the center of the voltage range that the average voltage in the output signal of the phase comparator 1j can be taken, the locked state can more stably be maintained against the environmental variation such as supply voltage variation, temperature change, jitter input or the like.

Figure 23:
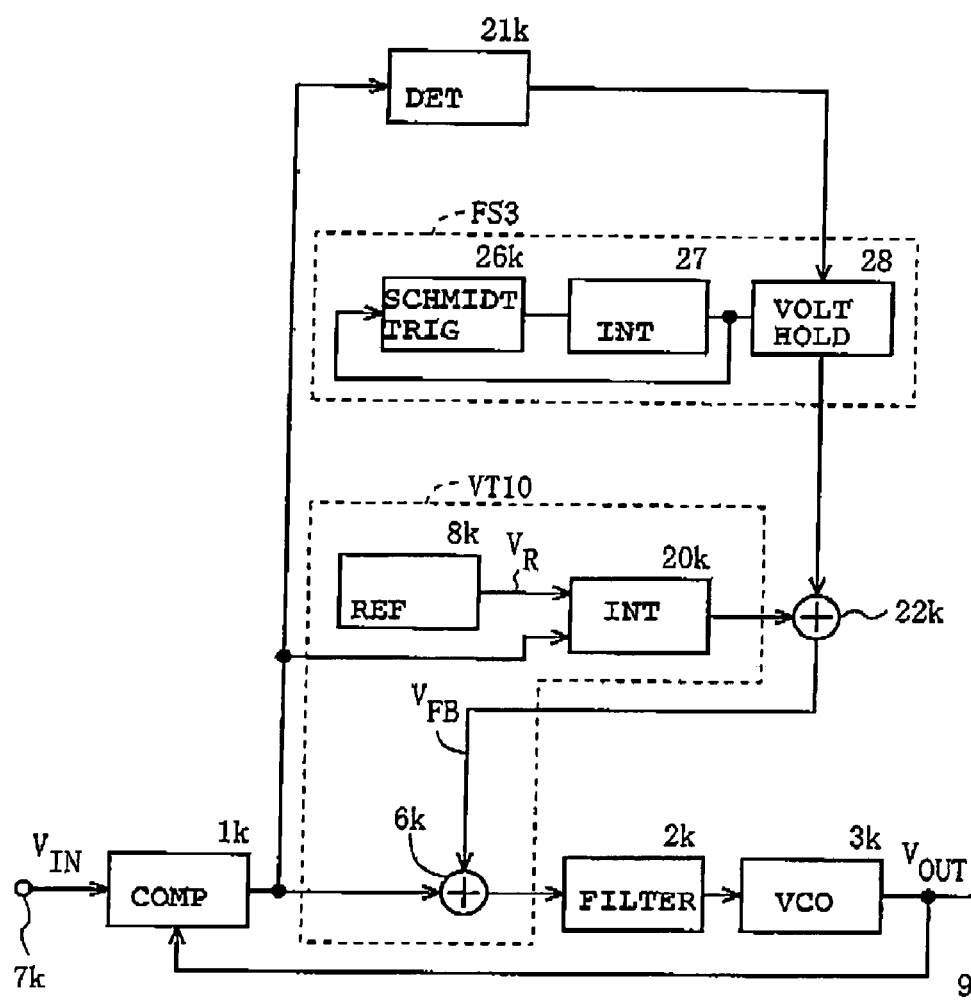
FIG. 23 is a block diagram showing a phase lock circuit PS10 that is the tenth embodiment of the present invention.

FIG. 23 is a block diagram showing a phase lock circuit PS10 that is the tenth embodiment of the present invention.

The phase lock circuit PS10 has a phase comparator 1k, a loop filter 2k, a voltage control oscillator 3k, a signal input terminal 7k, a signal output terminal 9k, a lock detector 21k, a retraction circuit FS3 that is an additional loop, and a voltage tracking circuit VT10 that is another additional loop.

The phase comparator 1k, loop filter 2k and voltage control oscillator 3k define the main body of the phase lock circuit. The retraction circuit FS3 comprises a Schmitt trigger circuit 26k, an integrator 27 and a voltage holding circuit 28. The voltage tracking circuit VT10 comprises a reference voltage generator 8k, a differential integrator 20k and an adder 6k. The additional retraction circuit in the conventional phase lock circuit PS112 is generally of a digital circuit for such a purpose that the variation in the output voltage of the retraction circuit FS1 can be suppressed to maintain the locked state stable. However, if the voltage tracking circuit is applied with the retraction circuit, the voltage tracking circuit can cancel any variation occurring in the output of the retraction circuit to greatly reduce the requirement of performance in the retraction circuit. Thus, the retraction circuit can be formed by an analog circuit reduced in circuit scale and power consumption. This can be accomplished by the retraction circuit FS3 according to the tenth embodiment of the present invention.

FIG. 24 is a circuit diagram showing an example of the Schmitt trigger circuit.

The Schmitt trigger circuit 26k may be a circuit which has hysteresis characteristics in the input and output (a history circuit), such as a Schmitt trigger inverter shown in FIG. 24 (1) or a hysteresis comparator shown in FIG. 24 (2) and (3). Since the Schmitt trigger type digital gate and analog hysteresis comparator are identical in electrical function with each other and only different from each other relating to the voltage used and term depending on the application, the tenth embodiment can use either of these circuits. In this description, these circuits will be referred to as Schmitt trigger circuit as the general term of such a circuitry as having hysteresis characteristics in input and output.

The Schmitt trigger circuit 26k and integrator 27 define an analog oscillator. The voltage holding circuit 28 causes the analog oscillator to output a signal when the lock detector 21k judges the unlocked state and holds and outputs a constant voltage when the lock detector 21k judges the locked state.

Figure 25:
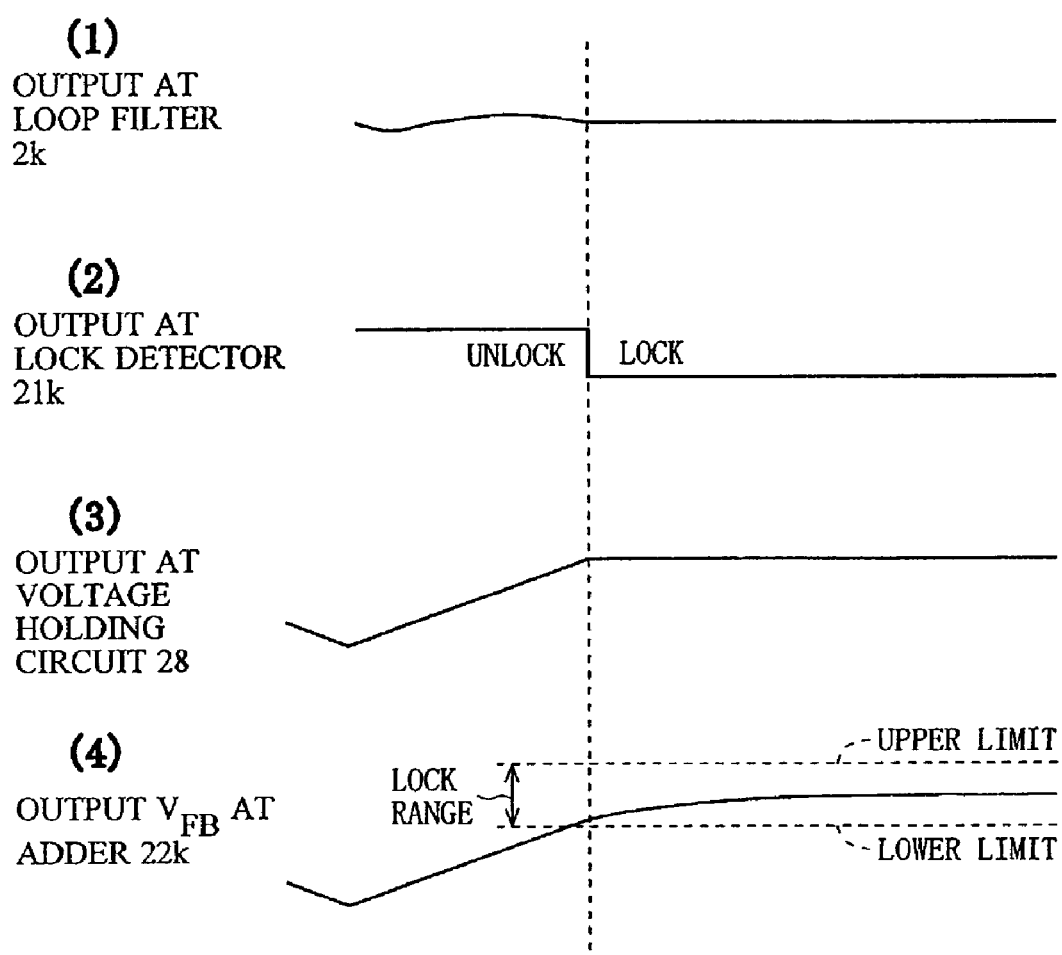
FIG. 25 is a view showing waveforms of the primary parts of the phase lock circuit PS10.

FIG. 25 is a view showing waveforms in the primary parts of the phase lock circuit PS10.

FIG. 25 (1) shows the output of the loop filter 2k; FIG. 25 (2) shows the output signal of the lock detector 21k; FIG. 25 (3) shows the output signal of the voltage holding circuit 28; and FIG. 25 (4) shows the output voltage $V_{FB}$ of the adder 22k.

At the initial stage (left side about a dotted line) of timing diagram, the phase lock circuit is in its unlocked state which is detected by the lock detector 21k to cause the analog oscillator formed by the Schmitt trigger circuit 26k and integrator 27 to generate a triangular wave. The triangular wave sweeps the output frequency of the voltage control oscillator 3k. At the time when the output frequency approaches the frequency of the input signal, the phase lock circuit is retracted. Thereafter, the lock detector 21n detects the locked state. The output voltage of the lock detector 21n is maintained constant to hold the locked state of the phase lock circuit by the voltage holding circuit 28. As a result, the pull-in range can be enlarged to a range in which the voltage control oscillator 3k can vary its oscillation frequency.

On the other hand, after the phase lock circuit has shifted from its unlocked state to its locked state, the output voltage $V_{FB}$ of the adder 22k is drawn to the desired voltage (e.g., a point near the center of the lock range) and stably held at the level by the voltage tracking circuit VT10. In other words, the lock range is enlarged by the voltage tracking circuit VT10.

The phase lock circuit PS 10 is characterized by that it is reduced in circuit scale and power consumption, in addition to the enlargement of the pull-in and lock ranges and the resistance against the environmental variation such as supply voltage variation, temperature change, jitter input or the like, in comparison with the phase lock circuit PS9.

Figure 26:
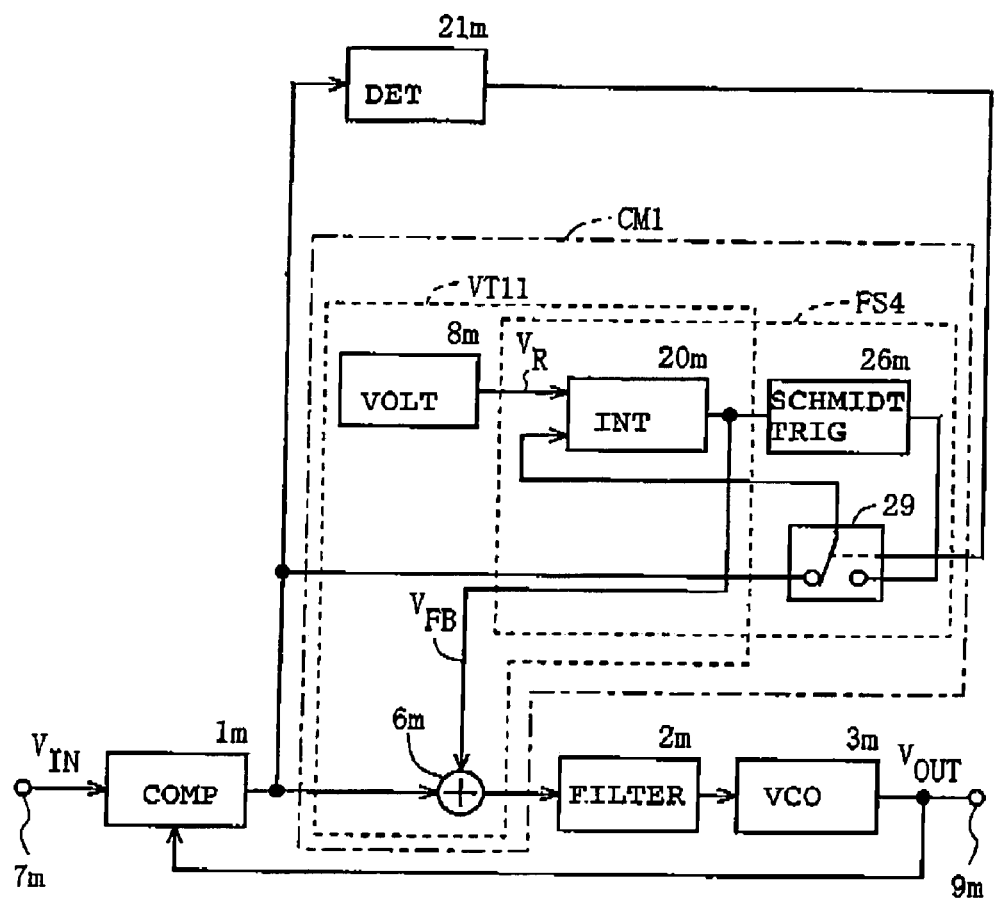
FIG. 26 is a block diagram showing a phase lock circuit PS11 that is the eleventh embodiment of the present invention.

FIG. 26 is a block diagram showing a phase lock circuit PS11 that is the eleventh embodiment of the present invention.

The phase lock circuit PS11 has a phase comparator 1m, a loop filter 2m, a voltage control oscillator 3m, a signal input terminal 7m, a signal output terminal 9m, a lock detector 21m, a retraction circuit FS 4 that is an additional loop and a voltage tracking circuit VT11 that is another additional loop.

The phase comparator 1m, loop filter 2m and voltage control oscillator 3m define the main body of the phase lock circuit. The retraction circuit FS4 comprises a Schmitt trigger circuit 26m, a differential integrator 20m and a switch 29. The voltage tracking circuit VT11 comprises a reference voltage generator 8m, a differential integrator 20m and an adder 6m. The retraction circuit FS4 and voltage tracking circuit VT11 share the differential integrator 20m to form a common circuit CM1.

Figure 27:
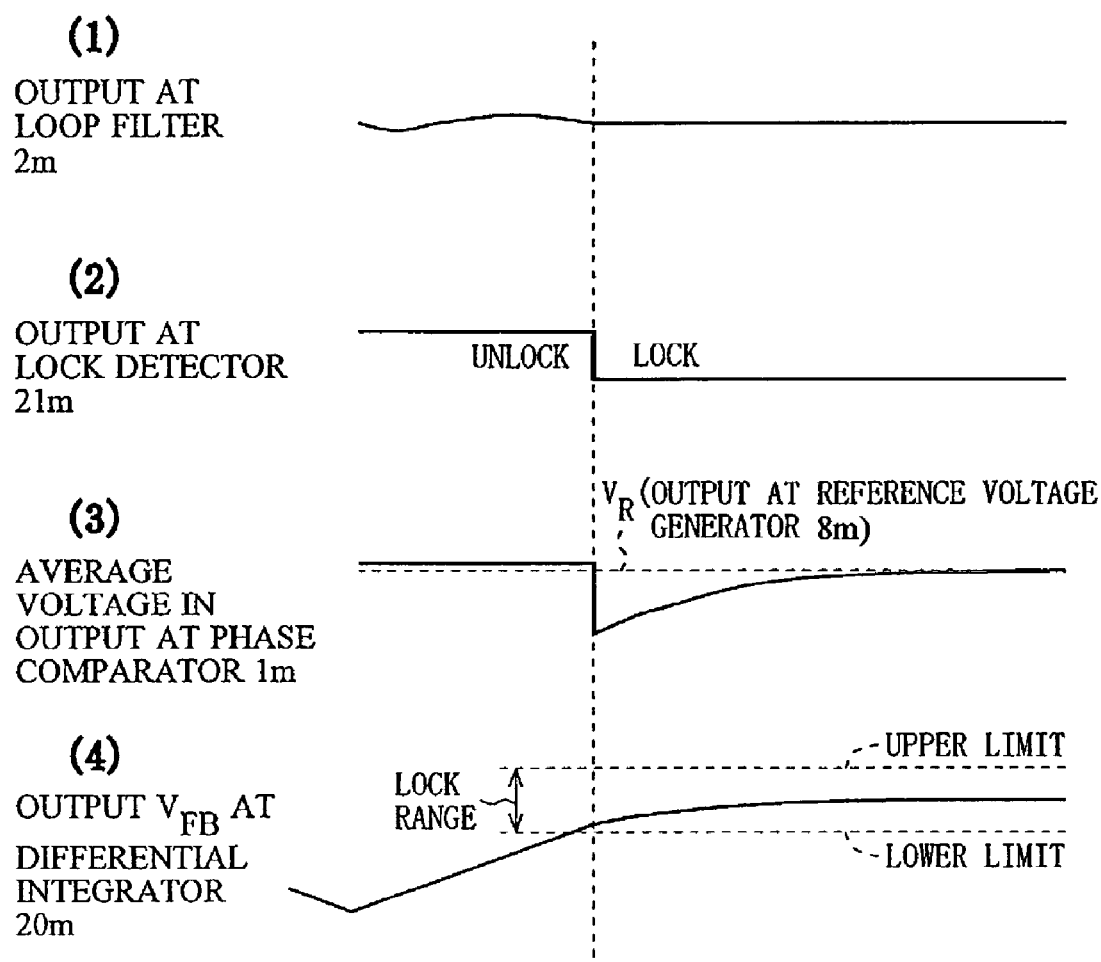
FIG. 27 is a view showing waveforms of the primary parts of the phase lock circuit PS11 that is the eleventh embodiment of the present invention.

FIG. 27 is a view showing waveforms in the primary parts of the phase lock circuit PS11 that is the eleventh embodiment of the present invention.

FIG. 27 (1) shows the output signal of the loop filter 2m; FIG. 27 (2) shows the output signal of the lock detector 21m; FIG. 27 (3) shows the average voltage in the output signal of the phase comparator 1m; and FIG. 27 (4) shows the output voltage $V_{FB}$ of the differential integrator 20m. FIG. 27 (3) also shows the output voltage $V_R$ of the reference voltage generator 8m.

At the initial stage (left side about a dotted line) of the timing diagram, the phase lock circuit is in its unlocked state; the lock detector 21m judges the unlocked state; the switch 29 selects the output signal of the Schmitt trigger circuit 26m; and an analog oscillator formed by the Schmitt trigger circuit 26m and differential integrator 20m generates a triangular wave. The triangular wave sweeps the output frequency of the voltage control oscillator 3m. At the time when the output frequency approaches the frequency of the input signal, the phase lock circuit is retracted. Thereafter, the lock detector 21m determines the lock. The switch 29 selects the output signal of the phase comparator 1m. The voltage tracking circuit VT11 controls the average voltage in the output of the phase comparator 1m (FIG. 27 (3)) so that it will coincide with the output voltage $V_R$ of the reference voltage generator. Thus, the lock state will be held stably. As a result, the pull-in range can be enlarged to the range in which the voltage control oscillator 3k can vary its oscillation frequency. Even though a jump occurs in the voltage inputted into the differential integrator 20m on switching of the switch 29, no jump will appear in the output of the differential integrator 20m. Therefore, the phase lock circuit can smoothly be shifted from its unlocked state to its locked state.

The Schmitt trigger circuit 26m may be any of various forms insofar as having hysteresis characteristics in input and output, such as a Schmitt trigger type digital gate or a hysteresis comparator. The switch 29 may be any analog switch. Since the phase comparator 1m and Schmitt circuit 26m can use digital type switches, however, the switch 29 may be realized by use of a digital gate type selector.

The output waveform of the analog oscillator is not limited to triangular waveform, but may be in the form of saw-tooth wave by differing the time constant in the voltage increasing process from that in the voltage decreasing process.

Although FIG. 26 has been described in connection with such a configuration that the output voltage $V_R$ of the reference voltage generator 8m is inputted into one of the inputs in the differential integrator 20m, irrespectively of the state of the switch 29, such a configuration is out of the period in which the switch 29 selects the Schmitt trigger 26m. In other words, when the switch 29 selects the Schmitt trigger 26m, one of the inputs of the differential integrator 20m (which receives the output voltage $V_R$ of the reference voltage generator 8m in FIG. 26) may provide any voltage within a range between the maximum and minimum voltages in the Schmitt trigger 26m, rather than the output voltage $V_R$ of the reference voltage generator 8m.

The phase lock circuit PS11 is further advantageous in that the retraction circuit FS4 and voltage tracking circuit VT11 share the common circuit CM1 to reduce both the circuit scale and power consumption, in addition to the enlargement of the pull-in and lock ranges and the resistance against the environmental variation such as supply voltage variation, temperature change, jitter input or the like, as in the phase lock circuits PS9 and PS10.

In the common circuit CM1, the retraction circuit FS 4 operates in the unlocked state while the voltage tracking circuit VT11 operates in the locked state. Since both the circuits will not simultaneously operate, it is advantageous in that there will not occur the reduction of operational speed due to the reverse control, the reduction of the effectively controllable range and so on.

Moreover, the phase lock circuit can smoothly be shifted from its unlocked state to its locked state since no jump will occur in the output voltage of the differential integrator 20m which is fed back to the main body of the phase lock circuit. This is advantageous in that the unlocked state hardly occurs due to any impact of shifting.

Figure 28:
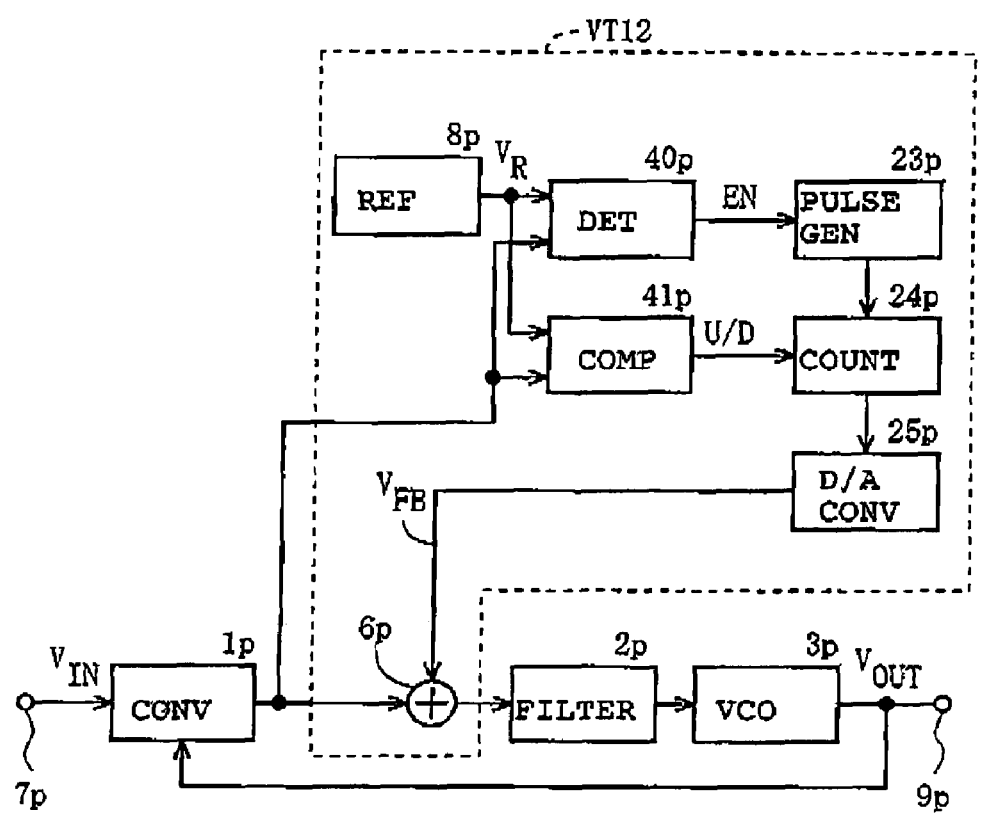
FIG. 28 is a block diagram showing a phase lock circuit PS12 that is the twelfth embodiment of the present invention.

FIG. 28 is a block diagram showing a phase lock circuit PS12 that is the twelfth embodiment of the present invention.

The phase lock circuit PS1 has a phase comparator 1p, a loop filter 2p, a voltage control oscillator 3p, a signal input terminal 7p, a signal output terminal 9p and a voltage tracking circuit VT1 that is an additional loop.

The phase comparator 1p, loop filter 2p and voltage control oscillator 3p define the main body of the phase lock circuit. The voltage tracking circuit VT12 comprises a reference voltage generator 8p, a voltage difference detector 40p, a comparator 41p, a pulse generator 23p, a counting circuit 24p and a D/A converter 25p.

The voltage tracking circuit VT11 of the phase lock circuit PS12 is of a digital type corresponding to the voltage tracking circuit VT1 of the phase lock circuit PS1. The operational principle thereof is substantially the same as that of the phase lock circuit PS1. The voltage difference detector 40p receives the output of the phase comparator 1p and the output voltage $V_R$ of the reference voltage generator 8p. If the difference between these voltages (or the difference between the averages for both the voltages) exceeds a predetermined voltage, the voltage difference detector 40p feeds an enable signal EN to the pulse generator 23p which is in turn oscillated.

On the other hand, the comparator 41p receives the output of the phase comparator 1p and the output voltage $V_R$ of the reference voltage generator 8p and compares them relating to the voltage (or the average voltage) to generate an output U/D signal which is in turn outputted therefrom toward the counting circuit 24p. The output signal of the pulse generator 23p is inputted into and counted by the counting circuit 24p. At this time, the direction of counting (up/down) is determined by the output U/D signal of the comparator 41p. The output of the counting circuit 24p is converted into a voltage by the D/A converter 25p, this voltage being added to the voltage path in the main body of the phase lock circuit. In such an arrangement, the voltage tracking circuit VT12 controls the average voltage in the output of the phase comparator 1p so that it will coincide with the output voltage $V_R$ of the reference voltage generator 8p.

FIG. 29 is a view showing waveforms in the primary parts of the phase lock circuit PS12 that is the twelfth embodiment of the present invention when it is in its locked state.

FIG. 29 (1) shows the output signal EN of the voltage difference detector 40p; FIG. 29 (2) shows the output signal of the pulse generator 23p; FIG. 29 (3) shows the output voltage $V_{FB}$ of the D/A converter 25pp; and FIG. 29 (4) shows the average voltage in the output signal of the phase comparator 1p. FIG. 29 (4) also shows the output voltage $V_R$ of the reference voltage generator 8p.

If the average voltage in the output of the phase comparator 1p is shifted to exceed the detection threshold (FIG. 29 (4)) of the voltage difference detector 40p due to the environmental variation such as supply voltage variation, temperature change or the like or the aged deterioration, the voltage difference detector 40p outputs the enable signal EN toward the pulse generator 23p which is in turn oscillated.

The counting circuit 24p varies its count in the direction (up/down) specified by the comparator 41p. Thus, the D/A converter 25p varies its output voltage $V_{FB}$. In association with this, the phase relationship between the average voltage in the output of the phase comparator 1p and the input signal $7pV_{IN}$ varies to approach the average voltage in the output of the phase comparator 1p to the output voltage $V_R$ of the reference voltage generator 8q. If the average voltage in the output of the phase comparator 1p as well as the output voltage $V_R$ of the reference voltage generator 8q decreases to be lower than the aforementioned threshold, the voltage difference detector 40p inverts the enable output EN to stop the pulse generator 23p. As a result, the average voltage in the output of the phase comparator 1p is held at a point near the output voltage $V_R$ of the reference voltage generator 8q. Thus, the locked state can be maintained stable.

Even though the frequency (or bit rate) of the input signal $7pV_{IN}$ varies, the voltage tracking circuit VT12 can held the average voltage in the output of the phase comparator 1p at a level near the output voltage $V_R$ of the reference voltage generator 8q. Namely, the voltage tracking circuit VT12 can enlarge the lock range.

The voltage difference detector 40p is interposed in order to provide a dead band in the operation of the voltage tracking circuit VT12. In other words, if the output voltage (or average voltage) of phase comparator 1p and the output voltage $V_R$ of the reference voltage generator 8p are within a predetermined voltage difference, the pulse generator 23p and voltage tracking circuit VT12 are turned off. This minimizes the influence of the voltage tracking circuit VT12 on the operation of the main phase lock circuit body. If the influence of the voltage tracking circuit VT12 on the main phase lock circuit body raises no problem, the voltage difference detector 40p may be omitted and the pulse generator 23p may always be oscillated.

Although the phase lock circuit PS12 has been described as to its configuration that the output voltage of the phase comparator 1p is inputted into the voltage tracking circuit VT12, the output of which is added to the output of the phase comparator 1p, the output signal of the voltage tracking circuit VT12 may be added to the output signal of the loop filter 2p. Alternatively, the output signal of the loop filter 2p may be inputted into the voltage tracking circuit VT12, the output signal of which is added to the output signal of the loop filter 2p. In addition, the voltage difference detector 40p may be either of the hysteresis comparator or window comparator.

When the voltage tracking circuit VT12 is added to the phase lock circuit PS12, the lock range is enlarged. The digital form of the voltage tracking circuit VT12 is advantageous in that it can easily be integrated and hardly be influenced by the environmental variation such as supply voltage variation, temperature change or the like. Since the voltage difference detector 40p provides a dead band in the operation of the voltage tracking circuit VT12, the influence of the voltage tracking circuit VT12 on the operation of the main phase lock circuit body can advantageously be minimized.

Figure 30:
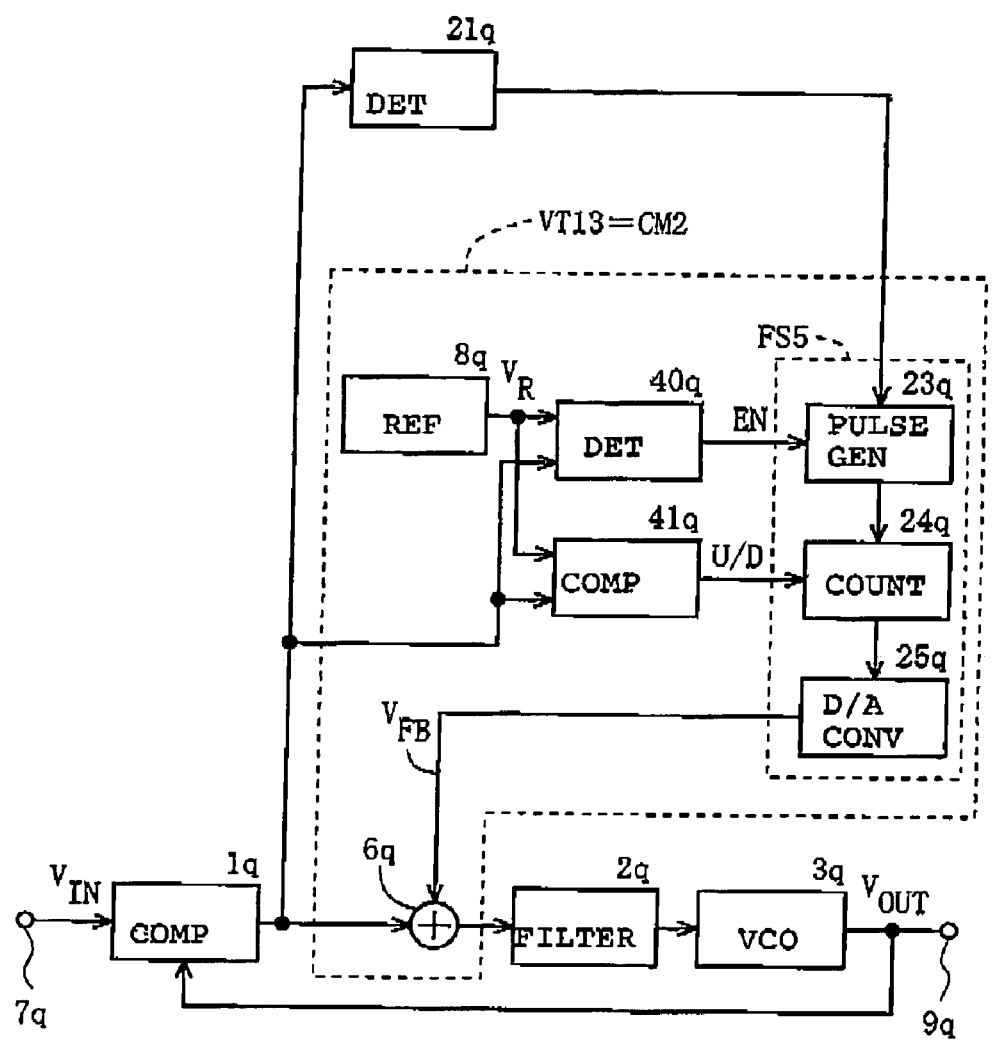
FIG. 30 is a block diagram showing a phase lock circuit PS13 that is the thirteenth embodiment of the present invention.

FIG. 30 is a block diagram showing a phase lock circuit PS13 that is the thirteenth embodiment of the present invention.

The phase lock circuit PS13 has a phase comparator 1q, a loop filter 2q, a voltage control oscillator 3q, a signal input terminal 7q, a signal output terminal 9q, a lock detector 21q, a retraction circuit FS5 that is an additional loop and a voltage tracking circuit VT13 that is another additional loop.

The phase comparator 1q, loop filter 2q and voltage control oscillator 3q define the main body of the phase lock circuit. The retraction circuit FS5 comprises a pulse generator 23q, a counting circuit 24q, and a D/A converter 25q. The voltage tracking circuit VT13 comprises a reference voltage generator 8q, a voltage difference detector 40q, a comparator 41q, a pulse generator 23q, a counting circuit 24q and a D/A converter 25q. The retraction circuit FS5 and voltage tracking circuit VT13 share part of the circuitry (including the pulse generator 23q, counting circuit 24q and D/A converter 25q) to form a common circuit CM2.

Figure 17:
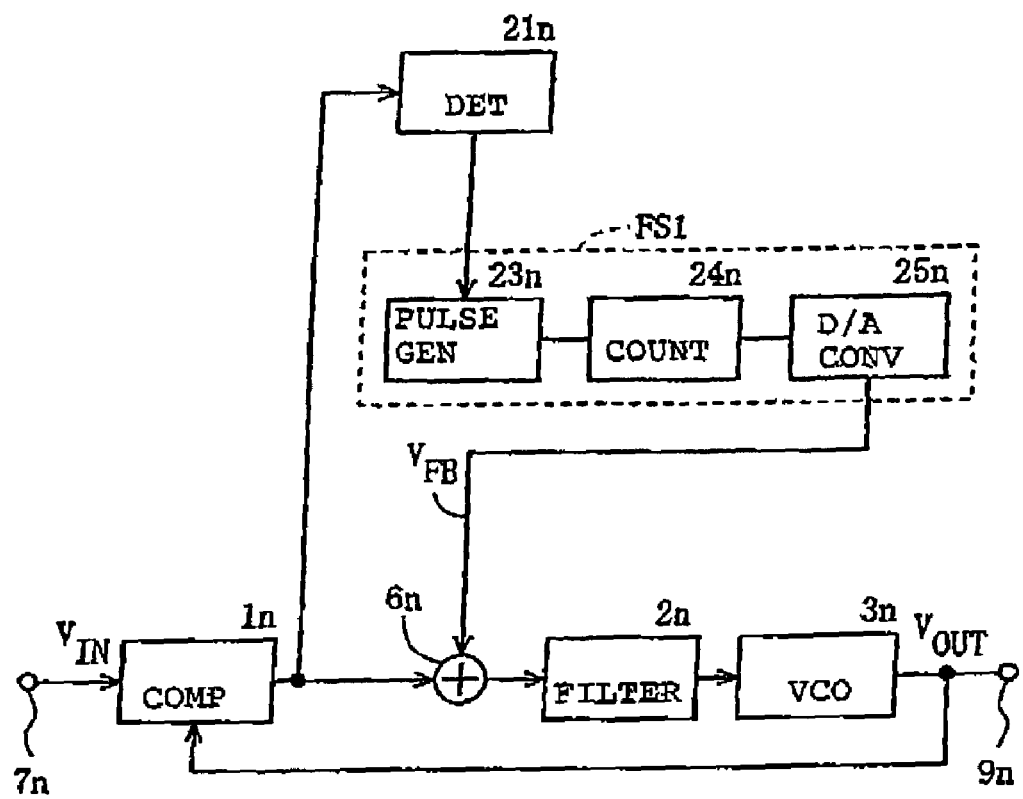
FIG. 17 is a block diagram of another phase lock circuit PS112 according to the prior art, to which a retraction circuit according to the prior art is added.
Figure 18:
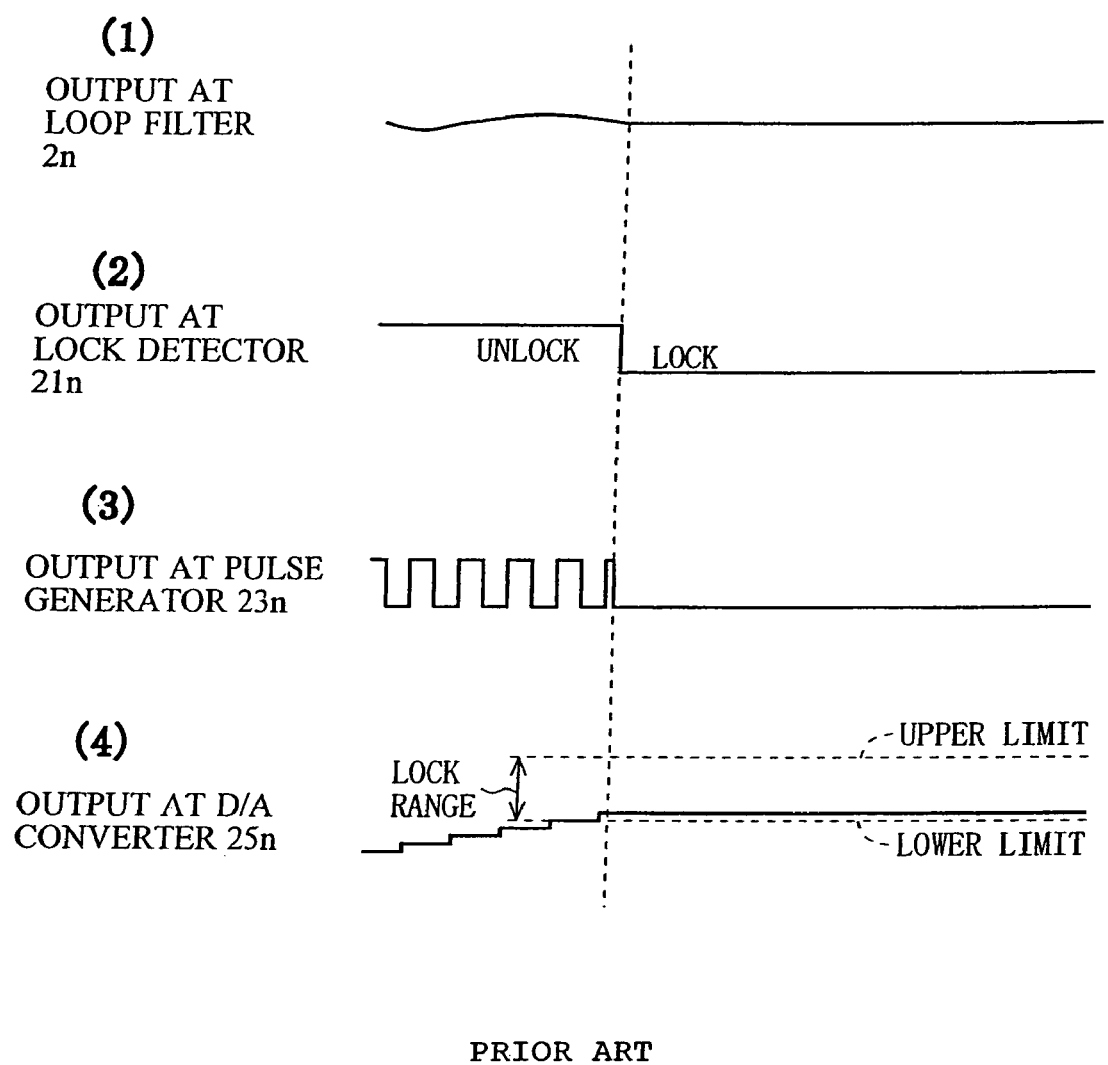
FIG. 18 is a view showing a waveform of a primary part in conventional phase synchronization circuit PS112 to which a retraction circuit was added.

In the phase lock circuit PS13, the voltage tracking circuit VT12 of the phase lock circuit PS12 is applied to the conventional phase lock circuit PS112 having the additional retraction circuit (FIG. 17). The retraction circuit and voltage tracking circuit share the pulse generator, counting circuit and D/A converter to form the common circuit CM2.

The operation of the retraction circuit FS5 is the same as that of the phase lock circuit PS9 while the operation of the voltage tracking circuit VT13 is the same as that of the phase lock circuit PS12.

Figure 31:
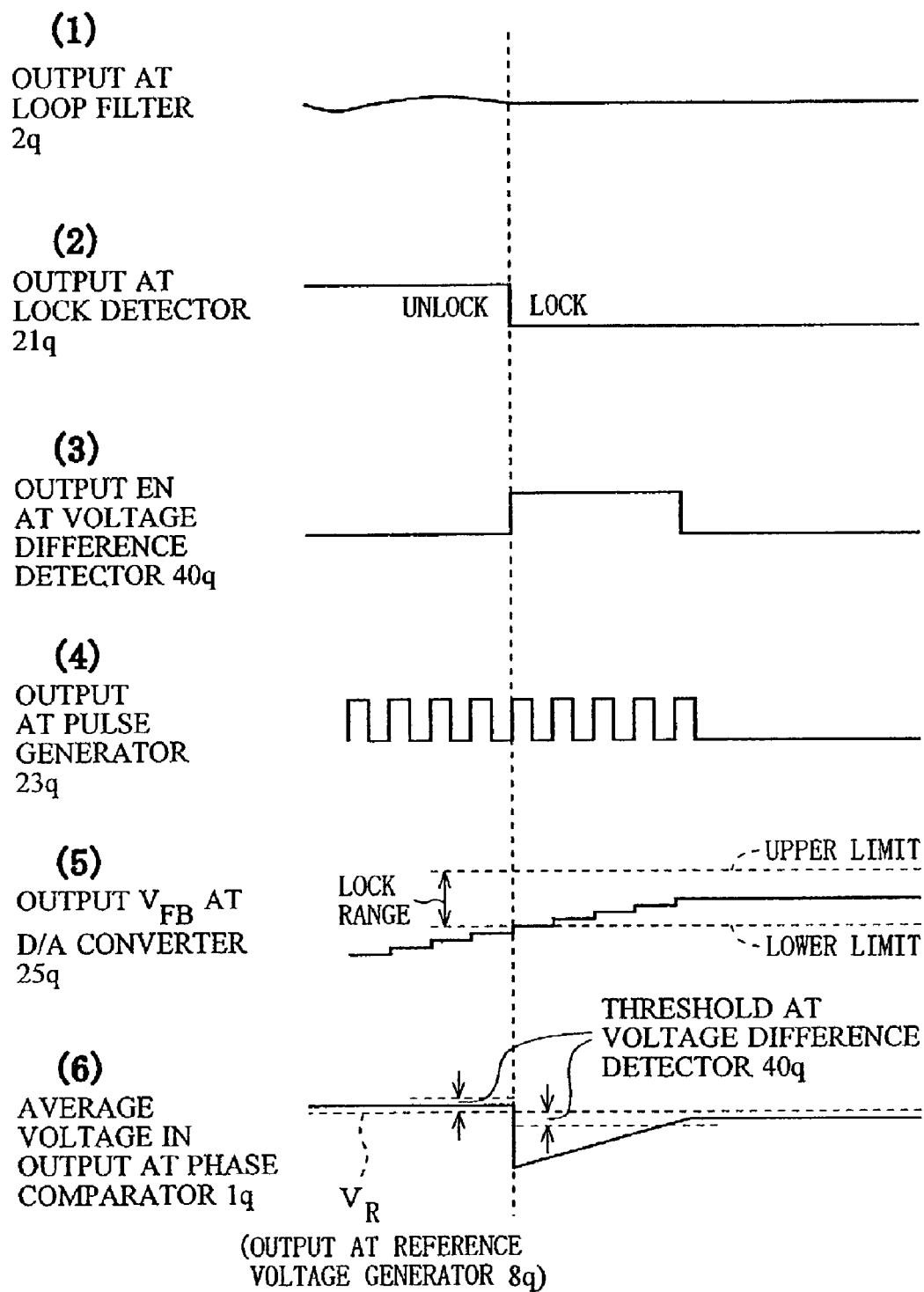
FIG. 31 is a view showing waveforms of the primary part of the phase lock circuit PS13.

FIG. 31 is a view showing waveforms in the primary parts of the phase lock circuit PS13.

FIG. 31 (1) shows the output signal of the loop filter 2q; FIG. 31 (2) shows the output signal of the lock detector 21q; FIG. 31 (3) shows the output signal EN of the voltage difference detector 40q; FIG. 31 (4) shows the output signal of the pulse generator 23q; FIG. 31 (5) shows the output signal of the D/A converter 25q; and FIG. 31 (6) shows the average voltage in the output signal of the phase comparator 1P. FIG. 31 (6) also shows the detection threshold of the voltage difference detector 40q.

At the initial stage (left side about a dotted line, left side) of the timing diagram, the phase lock circuit is in its unlocked state; the lock detector 21q discriminates the unlocked state; and the pulse generator 23q generates pulses. Thus, the D/A converter 25q varies the voltage stepwise.

When the phase lock circuit PS13 is brought into its locked state, the lock detector 21q judges the locked state. At this time point, the average voltage in the output of the phase comparator 1q does not coincide with the output voltage $V_R$ of the reference voltage generator 8q. The voltage difference detector 40q outputs an enable signal EN. Thus, the pulse generator 23q continues to oscillate. When the output voltage $V_{FB}$ of the D/A converter 25q varies, the phase relationship between the output signal of voltage control oscillator 3q and the input signal $7qV_{IN}$ also varies. Thus, the average voltage in the output of the phase comparator 1q also varies.

As the average voltage in the output of the phase comparator 1q coincides with the output voltage $V_R$ of the reference voltage generator 8q (strictly spealing, it falls within the threshold shown in FIG. 3 (6)), it is detected by the voltage difference detector 40q to stop the pulse generator 23q, thereby maintaining the locked state. Subsequently, even though the environmental variation such as supply voltage variation, temperature change or the like occurs to shift the average voltage in the output of the phase comparator 1q, such a shift is detected by the voltage difference detector 40q to oscillate the pulse generator 23q. The counting circuit 24q varies its count in the direction that cancels the aforementioned voltage shift. Thus, the phase lock circuit can be returned to its original state without unlocking. As a result, the locked state thereof can be maintained.

The phase lock circuit PS13 is advantageous in that the retraction circuit FS5 and voltage tracking circuit VT13 share the common circuit CM2 to reduce both the circuit scale and power consumption, in addition to the enlargement of the pull-in and lock ranges and the resistance against the environmental variation such as supply voltage variation, temperature change, jitter input or the like, as in the phase lock circuits PS11.

Since the phase lock circuit PS13 does not generate a jump on the output voltage of D/A converter 25q which is fed back to the main phase lock circuit body, it can smoothly be shifted from its unlocked state to its locked state, thereby hardly unlocking the phase lock circuit due to the impact of shift. The phase lock circuit PS13 compares the digital circuit performing the same function as that of the phase lock circuit PS11. Therefore, the phase lock circuit PS13 is more advantageous in the it can easily be integrated and hardly influenced by the environmental variation such as supply voltage variation, temperature change or the like.

In other words, each of the aforementioned embodiments provides a phase lock circuit comprising a signal path to which a phase comparator, a loop filter and a voltage control oscillator are connected in series, said phase comparator being adapted to compare the phase of an input signal $V_{IN}$ with the phase in the output signal of said voltage control oscillator and to output its result of comparison, said loop filter being adapted to receive the output signal of said phase comparator and to output a DC voltage; said voltage control oscillator being adapted to control the output oscillation frequency depending on the DC output voltage of said loop filter, said phase lock circuit further comprising voltage tracking circuit for adding, to the voltage of said signal path, a signal causing the average voltage in the output voltage of said phase comparator to coincide with a predetermined reference voltage, whereby said voltage tracking circuit can enlarge the lock range in said phase lock circuit.

Therefore, according to the aforementioned embodiments, the problem of the prior art in that the limitation of the duty ratio in the output of the phase comparator directly restricts the lock range can be overcome. Thus, the lock range can greatly be enlarged to the range of input frequency in which the voltage tracking circuit can maintain the duty ratio of the phase comparator output constant.

By adding the additional loop (or voltage tracking circuit) to the conventional phase lock circuit, the aforementioned embodiments can hold the synchronous state and extremely enlarge the lock range in comparison with the conventional phase lock circuit, without change of the duty ratio in the phase comparator output, even though the input frequency (or bit rate) varies or the voltage control oscillator is agedly deteriorated or the temperature varies.

The aforementioned embodiments are further advantageous in that the phase relationship between the input signal $V_{IN}$ and the output of the voltage control oscillator can arbitrarily be controlled by regulating the reference voltage $V_R$ of the voltage tracking circuit. With application to CDR, the aforementioned embodiments are further advantageous in that the yield strength against the jitter can always be maintained higher since the most allowable phase relationship can always be used.

This advantage can be provided similarly to a phase lock circuit which has its substantial lock range reduced by adding a retraction circuit thereto. In other words, even though the phase lock circuit having the additional retraction circuit is retracted at the end of the lock range, the lock range can greatly be enlarged since the voltage tracking circuit draws and holds the phase lock circuit to a predetermined duty ratio. Namely, the aforementioned embodiments can eliminate any additional circuit for compensating the aged variation and temperature change and greatly reduce the operation required by the regulation and the manufacturing cost.

Figure 32:
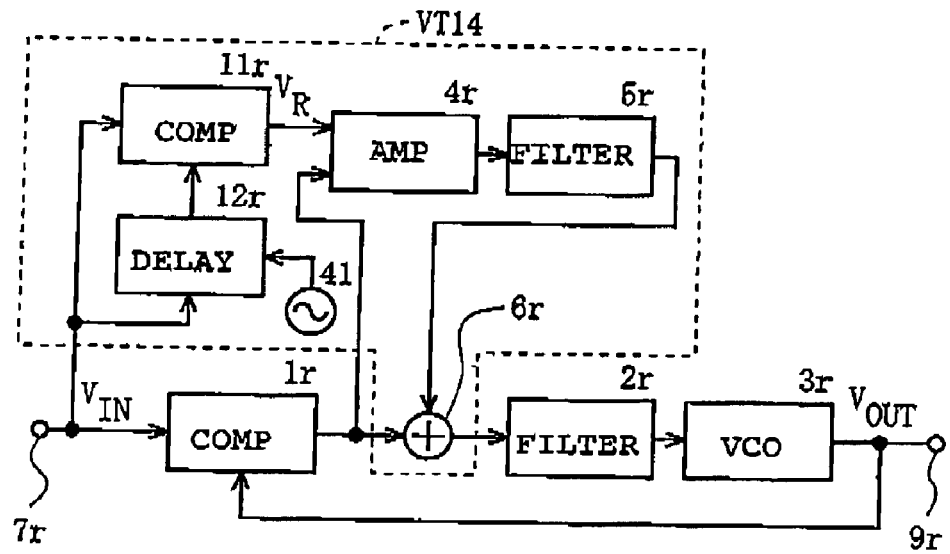
FIG. 32 is a block diagram showing a phase lock circuit PS14 that is the fourth embodiment of the present invention.

FIG. 32 is a block diagram showing a phase lock circuit PS14 that is the fourth embodiment of the present invention.

The phase lock circuit PS14 has a phase comparator 1r, a loop filter 2r, a voltage control oscillator 3r, a voltage tracking circuit VT14, a signal input terminal 7r and a signal output terminal 9r.

The voltage tracking circuit VT14 comprises a phase comparator 11r, a variable delay generator 12r, a differential amplifier 4r, a filter 5r, an adder 6r and an oscillator 41. The phase comparator 11r, variable delay generator 12r and oscillator 41 define a reference voltage generator.

The phase lock circuit PS14 generates a reference voltage in a manner different from that of the phase lock circuit PS7. In other words, the delay generator 12f of the phase lock circuit PS7 generates a fixed delay (e.g., a delay corresponding to 90 degrees phase) while the phase lock circuit PS14 uses the variable delay generator 12r (e.g., an infinite phase shifter for generating delays corresponding to 0–360 degrees phase). Furthermore, the quantity of delay in the variable delay generator 12r is periodically controlled by the oscillator 41.

In the phase lock circuit PS7, the reference voltage generator formed by the phase comparator 11f and delay generator 12f outputs a rectangular wave having its duty ratio of 50% as shown FIG. 12 (1) and (2). On the contrary, in the phase lock circuit PS14, the reference voltage generator formed by the phase comparator 11r, variable delay generator 12r and oscillator 41 outputs a rectangular wave having its duty ratio which is randomly variable between 0 and 100%. The variable duty ratio is provided from the fact that the oscillation frequency of the oscillator 41 is determined independently of the frequency (or bit rate) of the input signal 7r, thereby always varying the phase relationship.

In such a manner, the output of the reference voltage generator in the phase lock circuit PS14 has its duty ratio which is a randomly variable rectangular wave. High and low appear substantially at the same probability. Therefore, the output of the reference voltage generator will contain DC components substantially equal to those in the case where the duty ratio is fixed at 50% (as in the phase lock circuit PS7). Therefore, the reference voltage generator in the phase lock circuit PS14 can generate the reference voltage $V_R$ of the voltage tracking circuit VT14.

Although in the arrangement of the phase lock circuit PS14 shown in FIG. 32, both the output signals of the phase comparator 11r and phase comparator 1r are in the form of pulse signal, only DC components may be extracted by inserting filters into the respective inputs of the differential amplifier 4r, these DC signals being then inputted into the differential amplifier 4r. In this case, the similar operation can be realized even though high-frequency components have previously be removed as described, since the high-frequency components are finally removed by the filter 5r in the voltage tracking circuit VT14.

The reference voltage generator in the phase lock circuit PS14 does not have to adjust the delay in the delay generator (e.g., it adjusts into a fixed delay corresponding to 90 degrees phase). This is advantageous in that the yield strength is stronger against the aged deterioration and environmental variation such as supply voltage variation, temperature change or the like.

In other words, in the phase lock circuit PS14, the variable delay generator 12r in the reference voltage generator is an example of variable delay means for delaying the input signal $V_{IN}$ for any time period. The oscillator 41 is an example of oscillation means for oscillating a signal having a predetermined frequency for periodically controlling the delay in said variable delay means. The phase comparator 11r is an example of the second phase comparator which compares the phase of the input signal $V_{IN}$ with the output phase of said variable delay means.

Figure 33:
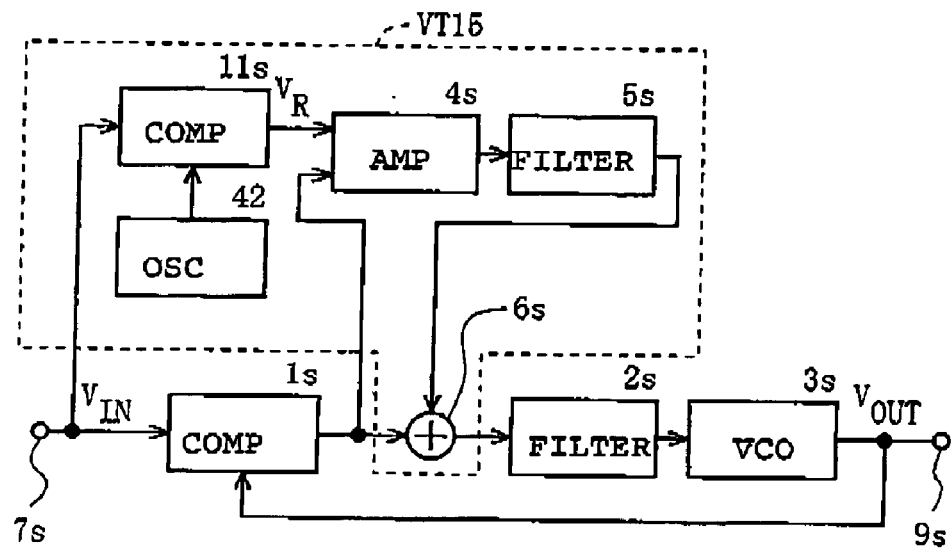
FIG. 33 is a block diagram showing a phase lock circuit PS15 that is the fifteenth embodiment of the present invention.

FIG. 33 is a block diagram showing a phase lock circuit PS15 that is the fifth embodiment of the present invention.

The phase lock circuit PS15 has a phase comparator 1s, a loop filter 2s, a voltage control oscillator 3s, a voltage tracking circuit VT15, a signal input terminal 7s and a signal output terminal 9s.

The voltage tracking circuit VT15 comprises a phase comparator 11s, a differential amplifier 4s, a filter 5s, an adder 6s and an oscillator 42. The phase comparator 11s and oscillator 42 define a reference voltage generator.

The phase lock circuit PS15 generates a reference voltage in a manner different from that of the phase lock circuit PS14. The phase lock circuit PS14 uses the variable delay generator 12r while the phase lock circuit PS15 does not use any delay generator and is adapted to input the output of the oscillator 42 directly into the phase comparator 11s. Since the oscillation frequency of the oscillator 42 is determined independently of the frequency (or bit rate) of the input signal 7s, the phase comparator 11s will output a rectangular wave having its duty ratio which is randomly variable between 0 and 100%. Since the output of the reference voltage generator in the phase lock circuit PS15 is a rectangular wave having its randomly variable duty ratio, high and low appear substantially at the same probability. Thus, The output will contain DC components substantially equal to those of the case where the duty ratio is fixed at 50% (or phase lock circuit PS7). Therefore, the reference voltage generator of the phase lock circuit PS15 can generate the reference voltage of the voltage tracking circuit VT15.

In the configuration of the phase lock circuit PS15 shown in FIG. 33, both the output signals of the phase comparator 11s and phase comparator is are in the form of pulse signal. However, only DC components may be extracted by inserting filters into the respective inputs of the differential amplifier 4s, these DC signals being then inputted into the differential amplifier 4s.

The reference voltage generator in the phase lock circuit PS15 ideally covers the duty ratio in the output of the phase comparator 11s between 0 and 100%, in addition to provision of a simplified and size-reduced circuitry, in comparison with the reference voltage generator of the phase lock circuit PS14. The probability in which high and low appear can be approached to about 50% with improved accuracy. Therefore, the reference voltage of the voltage tracking circuit VT15 can be generated in a more stable manner.

In the phase lock circuit PS15, the oscillator 42 is an example of oscillation means for oscillating a signal having a predetermined frequency. The phase comparator 11s is an example of the second phase comparator which compares the phase of the above-mentioned input signal $V_{IN}$ with that of the output signal from said oscillation means.

What is claimed is:

1. A phase lock circuit (phase-locked loop circuit) having a signal path to which a phase comparator, a loop filter and a voltage control oscillator (voltage-controlled oscillator) are connected in series, said phase comparator being adapted to compare the phase of an input signal $V_{IN}$ with the phase in the output signal of said voltage control oscillator and to output its result of comparison, said loop filter being adapted to receive the output signal of said phase comparator and to output a Direct Current (DC) voltage; said voltage control oscillator being adapted to control the output oscillation frequency depending on the DC output voltage of said loop filter, said phase lock circuit further comprising voltage tracking circuit for adding, to the voltage of said signal path, a signal causing the average voltage in the output voltage of said phase comparator to coincide with a predetermined reference voltage, whereby said voltage tracking circuit can enlarge the lock range in said phase lock circuit wherein said voltage tracking circuit comprises reference voltage generator means for generating a voltage within the output voltage range of said phase comparator, a differential amplifier for outputting a voltage proportional to a difference between the output voltage of said phase comparator and the output voltage of said reference voltage generator means, a filter for converting the output of said differential amplifier into DC voltage, and adder means for adding the output of said filter to the output voltage of said phase comparator and for outputting the result to said loop filter.

2. A phase lock circuit (phase-locked loop circuit) having a signal path to which a phase comparator, a loop filter, a voltage control oscillator (voltage-controlled oscillator), a lock detector and a retraction circuit are connected, said phase comparator being adapted to compare the phase of an input signal $V_{IN}$ with the phase in the output signal of said voltage control oscillator and to output its result of comparison, said loop filter being adapted to receive the output signal of said phase comparator and to output a Direct Current (DC) voltage, said voltage control oscillator being adapted to control the output oscillation frequency depending on the DC output voltage of said loop filter, said lock detector being adapted to judge whether the output signal of the said voltage control oscillator is locked or unlocked relative to said input signal $V_{IN}$ and to output the judgment result, said retraction circuit being a signal generator which is adapted to a scanning signal if said lock detector judges the unlocked state and to add the scanning signal to the voltage of said signal path, said phase lock circuit further comprising voltage tracking circuit for adding, to the voltage of said signal path, a signal causing the average voltage in the output voltage of said phase comparator to coincide with a predetermined reference voltage, whereby said voltage tracking circuit can enlarge the lock range in said phase lock circuit wherein said voltage tracking circuit comprises reference voltage generator means for generating a voltage within the output voltage range of said phase comparator, a differential amplifier for outputting a voltage proportional to a difference between the output voltage of said phase comparator and the output voltage of said reference voltage generator means, a filter for converting the output of said differential amplifier into DC voltage, and adder means for adding the output of said filter to the output voltage of said phase comparator and for outputting the result to said loop filter.

3. A phase lock circuit (phase-locked loop circuit) having a signal path to which a phase comparator, a loop filter and a voltage control oscillator (voltage-controlled oscillator) are connected in series, said phase comparator being adapted to compare the phase of an input signal $V_{IN}$ with the phase in the output signal of said voltage control oscillator and to output its result of comparison, said loop filter being adapted to receive the output signal of said phase comparator and to output a Direct Current (DC) voltage; said voltage control oscillator being adapted to control the output oscillation frequency depending on the DC output voltage of said loop filter, said phase lock circuit further comprising voltage tracking circuit for adding, to the voltage of said signal path, a signal causing the average voltage in the output voltage of said phase comparator to coincide with a predetermined reference voltage, whereby said voltage tracking circuit can enlarge the lock range in said phase lock circuit wherein said voltage tracking circuit comprises reference voltage generator means for generating a voltage within the output voltage range of said phase comparator, a differential integrator for outputting a voltage proportional to a difference between the output voltage of said phase comparator and the output voltage of said reference voltage generator means, and adder means for adding the output of said differential integrator to the output voltage of said phase comparator and for outputting the result to said loop filter.

4. A phase lock circuit (phase-locked loop circuit) having a signal path to which a phase comparator, a loop filter, a voltage control oscillator (voltage-controlled oscillator), a lock detector and a retraction circuit are connected, said phase comparator being adapted to compare the phase of an input signal $V_{IN}$ with the phase in the output signal of said voltage control oscillator and to output its result of comparison, said loop filter being adapted to receive the output signal of said phase comparator and to output a Direct Current (DC) voltage; said voltage control oscillator being adapted to control the output oscillation frequency depending on the DC output voltage of said loop filter, said lock detector being adapted to judge whether the output signal of the said voltage control oscillator is locked or unlocked relative to said input signal $V_{IN}$ and to output the judgment result, said retraction circuit being a signal generator which is adapted to a scanning signal if said lock detector judges the unlocked state and to add the scanning signal to the voltage of said signal path, said phase lock circuit further comprising voltage tracking circuit for adding, to the voltage of said signal path, a signal causing the average voltage in the output voltage of said phase comparator to coincide with a predetermined reference voltage, whereby said voltage tracking circuit can enlarge the lock range in said phase lock circuit wherein said voltage tracking circuit comprises reference voltage generator means for generating a voltage within the output voltage range of said phase comparator, a differential integrator for outputting a voltage proportional to a difference between the output voltage of said phase comparator and the output voltage of said reference voltage generator means, and adder means for adding the output of said differential integrator to the output voltage of said phase comparator and for outputting the result to said loop filter.

5. The phase lock circuit according to claim 1 or 3 wherein the Direct Current (DC) voltage converted from the output voltage of said phase comparator by another filter is inputted into said voltage tracking circuit.

6. The phase lock circuit according to claim 2 or 4 wherein the DC voltage converted from the output voltage of said phase comparator by another filter is inputted into said voltage tracking circuit.

7. The phase lock circuit according to claim 1 or 3 wherein said reference voltage generator means comprises delay means for delaying said input signal $V_{IN}$ for a predetermined time period, and a second phase comparator for receiving said input signal $V_{IN}$ and the output of said delay means.

8. The phase lock circuit according to claim 2 or 4 wherein said reference voltage generator means comprises delay means for delaying said input signal $V_{IN}$ for a predetermined time period, and a second phase comparator for receiving said input signal $V_{IN}$ and the output of said delay means.

9. The phase lock circuit according to claim 1 or 3 wherein said reference voltage generator means comprises delay means for delaying the output signal of said voltage control oscillator for a predetermined time period and a second phase comparator for receiving the output signal of said voltage control oscillator and the output signal of said delay means.

10. The phase lock circuit according to claim 2 or 4 wherein said reference voltage generator means comprises delay means for delaying the output signal of said voltage control oscillator for a predetermined time period and a second phase comparator for receiving the output signal of said voltage control oscillator and the output signal of said delay means.

11. The phase lock circuit according to claim 1 or 3 wherein said addition is carried out relative to the DC output voltage of said loop filter in said signal path.

12. The phase lock circuit according to claim 2 or 4 wherein said addition is carried out relative to the DC output voltage of said loop filter in said signal path.

13. A phase lock circuit (phase-locked loop circuit) having a signal path to which a phase comparator, a loop filter and a voltage control oscillator (voltage-controlled oscillator) are connected in series, said phase comparator being adapted to compare the phase of an input signal $V_{IN}$ with the phase in the output signal of said voltage control oscillator and to output its result of comparison, said loop filter being adapted to receive the output signal of said phase comparator and to output a Direct Current (DC) voltage; said voltage control oscillator being adapted to control the output oscillation frequency depending on the DC output voltage of said loop filter, said phase lock circuit further comprising voltage tracking circuit for adding, to the voltage of said signal path, a signal causing the average voltage in the output voltage of said phase comparator to coincide with a predetermined reference voltage, whereby said voltage tracking circuit can enlarge the lock range in said phase lock circuit wherein said voltage tracking circuit comprises reference voltage generator means for generating a voltage within the output voltage range of said phase comparator, voltage difference detector means for detecting a potential difference between the output voltage of said phase comparator and the output voltage of said reference voltage generator means when it exceeds a predetermined value, voltage comparator means for detecting a voltage difference between the output voltage of said phase comparator and the output voltage of said reference voltage generator means, pulse generator means for performing an oscillation when the voltage difference detector means detects that the potential difference between the output voltage of said phase comparator and the output voltage of said reference voltage generator means exceeds said predetermined value, counter means for counting the output of said pulse generator means, the direction of counting being controlled by the output of said voltage comparison means, and Digital-to-Analog (D/A) converter means for converting the result of count from said counter means into a voltage.

14. A phase lock circuit (phase-locked loop circuit) having a signal path to which a phase comparator, a loop filter, a voltage control oscillator (voltage-controlled oscillator), a lock detector and a retraction circuit are connected, said phase comparator being adapted to compare the phase of an input signal $V_{IN}$ with the phase in the output signal of said voltage control oscillator and to output its result of comparison, said loop filter being adapted to receive the output signal of said phase comparator and to output a Direct Current (DC) voltage; said voltage control oscillator being adapted to control the output oscillation frequency depending on the DC output voltage of said loop filter, said lock detector being adapted to judge whether the output signal of the said voltage control oscillator is locked or unlocked relative to said input signal $V_{IN}$ and to output the judgment result, said retraction circuit being a signal generator which is adapted to a scanning signal if said lock detector judges the unlocked state and to add the scanning signal to the voltage of said signal path, said phase lock circuit further comprising voltage tracking circuit for adding, to the voltage of said signal path, a signal causing the average voltage in the output voltage of said phase comparator to coincide with a predetermined reference voltage, whereby said voltage tracking circuit can enlarge the lock range in said phase lock circuit wherein said voltage tracking circuit comprises reference voltage generator means for generating a voltage within the output voltage range of said phase comparator, voltage difference detector means for detecting a potential difference between the output voltage of said phase comparator and the output voltage of said reference voltage generator means when it exceeds a predetermined value, voltage comparator means for detecting a voltage difference between the output voltage of said phase comparator and the output voltage of said reference voltage generator means, pulse generator means for performing an oscillation when the voltage difference detector means detects that the potential difference between the output voltage of said phase comparator and the output voltage of said reference voltage generator means exceeds said predetermined value, counter means for counting the output of said pulse generator means, the direction of counting being controlled by the output of said voltage comparison means, and Digital-to-Analog (D/A) converter means for converting the result of count from said counter means into a voltage.

15. The phase lock circuit according to claim 2 or 4 wherein said retraction circuit comprises pulse generator means for continuing pulses with a predetermined cycle when said lock detector means detects the unlock, counter means for counting the number of pulses from said pulse generator means, and D/A converter means for converting the result of count from said counter means into a voltage.

16. The phase lock circuit according to claim 2 or 4 wherein said retraction circuit comprises Schmitt trigger means, integration means for integrating the output voltage of said Schmitt trigger means and for feeding the result of integration back to the input of said Schmitt trigger means, and voltage holding means for outputting the output voltage of said integration means when said lock detector means judges the unlock and for outputting a constant voltage when said lock detector means judges the lock.

17. The phase lock circuit according to claim 2 or 4 wherein said retraction means comprises Schmitt trigger means for receiving the output voltage of said voltage tracking circuit, and circuit switching means for feeding the output of said Schmitt trigger means to said voltage tracking circuit when said lock detector means detects the unlock and for feeding the output of said phase comparator to the input of said voltage tracking circuit when said lock detector means detects the lock.

18. The phase lock circuit according to claim 2 or 4 wherein said retraction circuit wherein at least one of the pulse generator means, counter means and Digital-to-Analog (D/A) converter means included in said retraction circuit and the pulse generator means, counter means and D/A converter means included in said voltage tracking circuit is shared by said retraction circuit and voltage tracking circuit.

19. The phase lock circuit according to claim 1 or 3 wherein said reference voltage generator means comprises variably delay means for delaying said input signal $V_{IN}$ for any time period, oscillation means for oscillating a signal having a predetermined frequency to periodically control the delay in said variable delay means, and a second phase comparator for comparing the phase of said input signal $V_{IN}$ with the phase in the output signal of said variable delay means.

20. The phase lock circuit according to claim 2 or 4 wherein said reference voltage generator means comprises variably delay means for delaying said input signal $V_{IN}$ for any time period, oscillation means for oscillating a signal having a predetermined frequency to periodically control the delay in said variable delay means, and a second phase comparator for comparing the phase of said input signal $V_{IN}$ with the phase in the output signal of said variable delay means.

21. The phase lock circuit according to claim 1 or 3 wherein said reference voltage generator means comprises oscillation means for oscillating a signal having a predetermined frequency, and a second phase comparator for comparing the phase of said input signal $V_{IN}$ with the phase in the output signal of said oscillation means.

22. The phase lock circuit according to claim 2 or 4 wherein said reference voltage generator means comprises oscillation means for oscillating a signal having a predetermined frequency, and a second phase comparator for comparing the phase of said input signal $V_{IN}$ with the phase in the output signal of said oscillation means.

* * * * *

UNITED STATES PATENT AND TRADEMARK OFFICE
CERTIFICATE OF CORRECTION

PATENT NO. : 7,054,403 B2  
APPLICATION NO. : 09/979254  
DATED : May 30, 2006  
INVENTOR(S) : Hideyuki Nosaka et al.

It is certified that error appears in the above-identified patent and that said Letters Patent is hereby corrected as shown below:

Col. 1 and  
Item (54) Title of Invention: Change "Phase-Locked Loop" to --PHASE LOCK CIRCUIT--

Item (75) Inventors: Change "Hideyuki Nosaka, Musashino (JP); Hiroyuki Fukuyama, Musashino (JP); Hideki Kamitsuna, Musashino (JP)" to --Hideyuki Nosaka, Musashino (JP); Hiroyuki Fukuyama, Musashino (JP); Hideki Kamitsuna, Musashino (JP); Masahiro Muraguchi, Yokohama (JP); Mikio Yoneyama, Isehara (JP); Hiroaki Sasaki, Ebina (JP)--

Signed and Sealed this

Twenty-ninth Day of April, 2008

JON W. DUDAS  
*Director of the United States Patent and Trademark Office*